United States Patent
Lim et al.

(10) Patent No.: US 11,694,730 B2
(45) Date of Patent: Jul. 4, 2023

(54) MEMORY DEVICE, METHOD OF OPERATING THE MEMORY DEVICE, MEMORY MODULE, AND METHOD OF OPERATING THE MEMORY MODULE

(71) Applicant: SAMSUNG ELECTRONICS CO., LTD., Suwon-si (KR)

(72) Inventors: Sunyoung Lim, Suwon-si (KR); Jaegon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 17/541,679

(22) Filed: Dec. 3, 2021

(65) Prior Publication Data
US 2022/0093143 A1    Mar. 24, 2022

Related U.S. Application Data

(62) Division of application No. 16/821,615, filed on Mar. 17, 2020, now Pat. No. 11,222,671.
(Continued)

(30) Foreign Application Priority Data

Jan. 23, 2020    (KR) .................. 10-2020-0009397

(51) Int. Cl.
*G11C 7/10* (2006.01)
*G06F 9/30* (2018.01)
*G11C 7/22* (2006.01)

(52) U.S. Cl.
CPC ........ *G11C 7/1045* (2013.01); *G06F 9/30047* (2013.01); *G11C 7/1012* (2013.01);
(Continued)

(58) Field of Classification Search
CPC ... G11C 7/1045; G11C 7/1012; G11C 7/1039; G06F 9/30047
(Continued)

(56) References Cited

U.S. PATENT DOCUMENTS 7,965,530 B2    6/2011    Han et al.
9,753,651 B2    9/2017    Choi
(Continued)

FOREIGN PATENT DOCUMENTS

WO    WO2013016723 A2    1/2013

OTHER PUBLICATIONS

European Search Report dated Oct. 1, 2020 Cited in European Application No. 20180369.9-1224.

*Primary Examiner* — Vu A Le
(74) *Attorney, Agent, or Firm* — Volentine, Whitt & Francos, PLLC

(57) ABSTRACT

A method is for operating a nonvolatile dual in-line memory module (NVDIMM). The NVDIMM includes a dynamic random access memory (DRAM) and a nonvolatile memory (NVM) device, the DRAM including a first input/output (I/O) port and a second I/O port, and the second I/O port connected to the NVM device. The method includes receiving an externally supplied command signal denoting a read/write command and a transfer mode, driving a multiplexer to select at least one of the first and second I/O ports according to the transfer mode of the command signal, and reading or writing data according to the read/write command of the command signal in at least one of the DRAM and NVM device using the at least one of the first and second I/O ports selected by driving the multiplexer.

18 Claims, 26 Drawing Sheets

Related U.S. Application Data

(60) Provisional application No. 62/863,936, filed on Jun. 20, 2019.

(52) U.S. Cl.
CPC .......... *G11C 7/1039* (2013.01); *G11C 7/1075* (2013.01); *G11C 7/22* (2013.01)

(58) Field of Classification Search
USPC .................................................... 365/189.05
See application file for complete search history.

(56) References Cited

U.S. PATENT DOCUMENTS

| | | |
|---|---|---|
| 9,767,903 B2 | 9/2017 | Cho |
| 10,147,712 B1 | 12/2018 | Lendvay |
| 10,241,727 B1 | 3/2019 | Shallal |
| 2010/0077130 A1* | 3/2010 | Kwon .................. G06F 9/4405 711/E12.002 |
| 2010/0205348 A1 | 8/2010 | Moshayedi |
| 2017/0075576 A1 | 3/2017 | Cho |
| 2018/0246790 A1 | 8/2018 | Sankaranarayanan et al. |
| 2019/0189210 A1 | 6/2019 | Farmahini Farahani |

\* cited by examiner

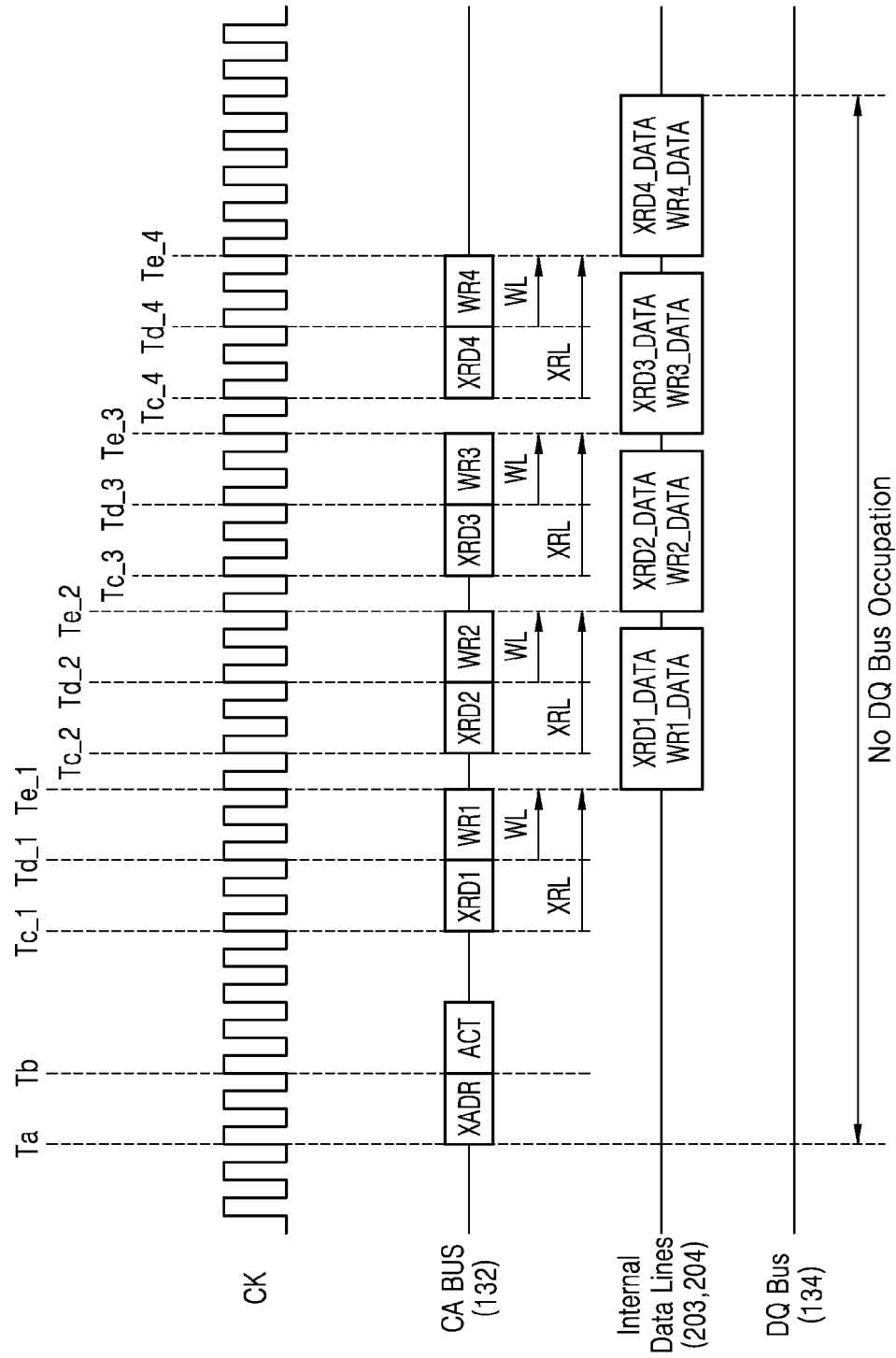

MEMORY DEVICE, METHOD OF OPERATING THE MEMORY DEVICE, MEMORY MODULE, AND METHOD OF OPERATING THE MEMORY MODULE

CROSS-REFERENCE TO RELATED APPLICATION

This is a Divisional of U.S. application Ser. No. 16/821,615, filed Mar. 17, 2020, and a claim of priority is made to U.S. Provisional Application No. 62/863,936, filed on Jun. 20, 2019, in the United States Patent and Trademark Office, and to Korean Patent Application No. 10-2020-0009397, filed Jan. 23, 2020, in the Korean Intellectual Property Office, the disclosures of which are incorporated herein in their entirety by reference.

BACKGROUND

The inventive concept relates to a memory device, a method of operating the memory device, a memory module, and a method of operating the memory module, and more particularly, to a memory device including a dual port, a method of operating the memory device, a memory module, and a method of operating the memory module.

A mobile-oriented memory device, such as a low-power double data rate synchronous dynamic random access memory (LPDDR SDRAM), has mainly been used in mobile electronic devices such as smartphones, tablet personal computers (PCs), and ultrabooks. As the capacity of mobile operating systems (OSs) increase to support multi-tasking performed in mobile electronic devices, mobile electronic devices having low power consumption and high-speed operation performance are required.

In addition, due to its advantages such as large capacity, low noise, and low power, non-volatile memory, such as flash memory, has widely been used as a storage device in various fields. In particular, a solid-state drive (SSD) implemented based on flash memory is used as a mass storage device in a personal computer (PC), a laptop computer, a workstation, a server system, and the like. Typical SSD devices are connected to a computer system based on a serial advanced technology attachment (SATA) interface or a peripheral component interconnect-express (PCI-E) interface. However, in recent years, as the amount of data processed in computing systems has increased, data bottlenecks have occurred because data throughput increases as compared to a data bandwidth or communication speed of an interface connected to SSD devices. These phenomena may deteriorate the performance of a computing system, and various techniques for improving performance have been developed to solve the above-described problems.

SUMMARY

According to an aspect of the inventive concepts, a method of operating a nonvolatile dual in-line memory module (NVDIMM) is provided. The NVDIMM includes a dynamic random access memory (DRAM) and a nonvolatile memory (NVM) device, the DRAM including a first input/output (I/O) port and a second I/O port, and the second I/O port connected to the NVM device. The method includes receiving an externally supplied command signal denoting a read/write command and a transfer mode, driving a multiplexer to select at least one of the first and second I/O ports according to the transfer mode of the command signal, and reading or writing data according to the read/write command of the command signal in at least one of the DRAM and NVM device using the at least one of the first and second I/O ports selected by driving the multiplexer.

According to another aspect of the inventive concepts, a method of operating a nonvolatile dual in-line memory module (NVDIMM) is provided. The NVDIMM includes a dynamic random access memory (DRAM) and a nonvolatile memory (NVM) device, the DRAM including a first input/output (I/O) port and a second I/O port, where the first I/O port is connected to an external device and the second I/O port is connected to the NVM device. The method includes receiving an externally supplied read/write command signal denoting a read/write command and one of a plurality of transfer modes, and reading or writing data according to the read/write command from or to at least one of the DRAM and NVM device using at least one of the first and second I/O ports of the DRAM as indicated by the one of the plurality of transfer modes. The plurality of transfer modes includes a first transfer mode in which data is exchanged between the DRAM and the external device using the first I/O port of the DRAM while the second I/O port of the DRAM is idle, a second transfer mode in which data is exchanged between the DRAM and the NVM device using the second I/O port of the DRAM while the first I/O port of the DRAM is idle, and a third transfer mode in which data is simultaneously exchanged between the DRAM and the external device using the first I/O port of the DRAM and between the DRAM and the NVM device using the second I/O port of the DRAM.

According to yet another aspect of the inventive concepts, a method of operating a nonvolatile dual in-line memory module (NVDIMM) is provided. The NVDIMM includes a multiport dynamic random access memory (DRAM), and a nonvolatile memory (NVM) device including an NVM and an NVM controller. The method includes receiving an externally supplied first command, reading data from the NVM and storing the data in the NVM controller in response to the first command, transmitting a ready signal externally of the NVDIMM, receiving an externally supplied second command, transmitting an internal read command to the NVM controller in response to the second command, transmitting an internal write command to the DRAM a period of time after transmitting the internal read command to the NVM controller, and transferring the data from the NVM controller to the DRAM in response to the internal read and write commands.

According to still another aspect of the inventive concepts, a method of operating a memory system is provided. The memory system including a host device, and first and second nonvolatile dual in-line memory modules (NVDIMMs) connected to the host device over a same channel. The method includes transmitting a flush command over the channel from the host to the first NVDIMM, flushing first data from a DRAM of the first NVDIMM to a nonvolatile memory (NVM) of the first NVDIMM in response to the flush command, and transmitting second data over the channel between the host and the second NVDIMM simultaneously with the flushing of the first data from the DRAM of the first NVDIMM to the NVM of the first NVDIMM.

According to another aspect of the inventive concepts, a nonvolatile dual in-line memory module (NVDIMM) is provided that includes a multiport dynamic random access memory (DRAM) including memory cells, a first input/output (I/O) port and a second I/O port, and a nonvolatile memory (NVM) connected to the second I/O port of the multiport DRAM. The multiport DRAM further includes a data path generating circuit configured to selectively form a first data path between the memory cells and the first I/O port, a second data path between the memory cells and the second I/O port, and a third data path between the first I/O port and the second I/O port that bypasses the memory cells.

According to another aspect of the inventive concepts, a multiport dynamic random access memory (DRAM) is provided that includes memory cells, control logic configured to control reading and writing of data from and to the memory cells, a first input/output (I/O) port, a second I/O port, and a data path generating circuit configured to selectively form a first data path between the memory cells and the first I/O port, a second data path between the memory cells and the second I/O port, and a third data path between the first I/O port and the second I/O port that bypasses the memory cells.

BRIEF DESCRIPTION OF THE DRAWINGS

Embodiments of the inventive concept will be more clearly understood from the following detailed description taken in conjunction with the accompanying drawings in which:

FIGS. 20A and 20B are a timing diagram and a flow diagram for reference in describing an example of multiple transfers of data using a single activation command according to embodiments of the inventive concepts.

DETAILED DESCRIPTION OF THE EMBODIMENTS

Figure 1:
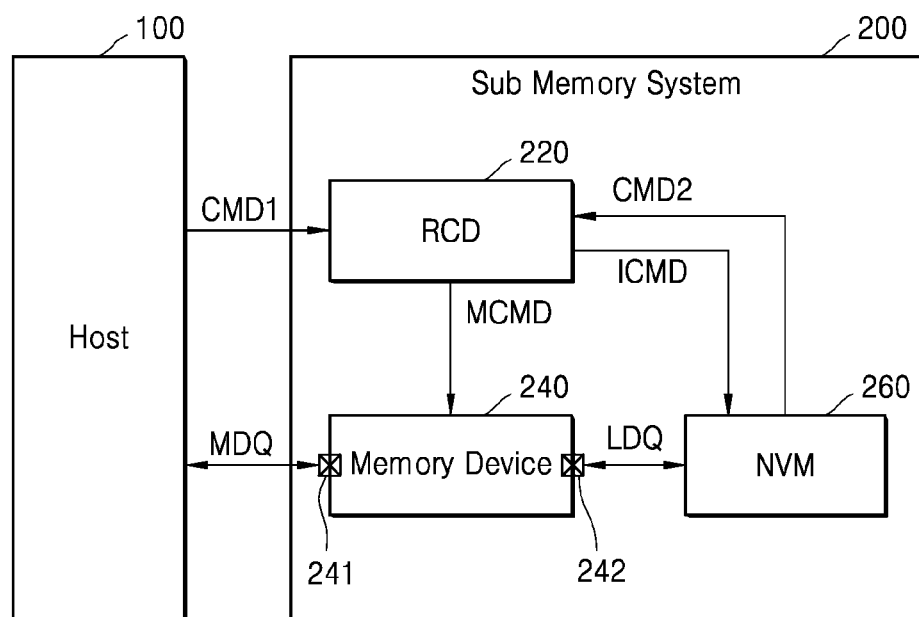
FIG. 1 is a diagram of a data processing system according to an example embodiment.

FIG. 1 is a schematic diagram of a data processing system 10 according to an example embodiment. The data processing system 10 of this example includes a host 100 and a sub-memory system 200. The data processing system 10 may be applied to or implemented within a variety of different electronic devices requiring data storage capabilities. Non-limiting examples of such devices include servers, desktop computers, laptop computers, smartphones, tablet personal computers, printers, scanners, monitors, digital cameras, digital music players, digital media recorders, and portable game consoles.

The host 100 may process data and control components included in the data processing system 10. For example, the host 100 may drive one or more operating systems OS and execute various applications on the one or more operating systems OS. Among these operations, the host 100 may write data to the sub-memory system 200 and/or read data from the sub-memory system 200. In some embodiments, the sub-memory system 200 is a non-volatile dual in-line memory module (NVDIMM).

The host 100 may provide a first command signal CMD1 to the sub-memory system 200 through a command/address line CMD1 and communicate data MDQ to and from the sub-memory system 200 through a data line MDQ. For ease of explanation, a signal and a line carrying the signal are given the same alphanumeric descriptors (e.g., CMD1, MDQ, etc.) throughout the description herein.

The first command signal CMD1 is described in more detail later with reference to FIG. 2. In some embodiments, the first command signal CMD1 includes a read command or a write command (collectively referred to as a read/write command) and a flag signal indicative of a transfer mode (to be described later). The first command signal CMD1 may further include a memory address of a memory device 240 and/or a non-volatile memory system (NVM) 260 of the sub-memory system 200. In addition, the first command signal CMD1 may further include other signals not described herein. Separately, the host 100 may provide data through the data line MDQ to the sub-memory system 200 or receive data through the data line MDQ from the sub-memory system 200.

As shown in FIG. 1, the sub-memory system 200 may include a register clock driver (RCD) 220, the memory device 240, and the NVM 260. The sub-memory system 200 may store data in the memory device 240 or provide data to the NVM 260 at the request of the host 100. In some embodiments, the memory device 240 is a dynamic random access memory (DRAM) which functions as a cache memory for the NVM 260. In nonlimiting examples, the sub-memory system 200 may be implemented as a multichip module or as a single chip. When the sub-memory system 200 is implemented as a multichip module, the sub-memory system 200 may be referred to as a memory module. As previously mentioned, in some embodiments the sub-memory system is a non-volatile dual in-line memory module (NVDIMM).

In operation, the RCD 220 may receive the first command signal CMD1 provided by the host 100. In addition, the RCD 220 may receive a second command signal CMD2 provided by the NVM 260. Further, in response to the first command signal CMD1 and/or second command signal CMD2, the RCD 220 may generate a memory command signal MCMD that is transmitted to the memory device 240 and/or an NMV command signal ICMD that is transmitted to the NVM 260. In an embodiment, the memory command signal MCMD includes an internal flag signal indicative of the transfer mode represented by the flag signal of the first command signal CMD1. Alternatively, in an embodiment, the memory command signal MCMD may omit the flag signal and instead embed data representative of the transfer mode. Alternatively, a signal indicative of the transfer mode may be separately transmitted. In an embodiment, the RCD 220 may also perform at least some of the ordinary functions of a memory controller and data buffer.

The memory device 240 may be a dual port device. For example, the memory device 240 may include a first I/O port 241 and a second I/O port 242. In some embodiments, the memory device 240 is a dual port DRAM. The memory device 240 may exchange data with the host 100 through the data line MDQ of one or more data communication channels connected through the first I/O port 241. In addition, the memory device 240 may exchange data with the NVM 260 through the data line LDQ connected through the second I/O port 242. Herein, the phrase 'exchange data' denotes the transmission of data and the receiving of data, and may be generally referred to as data communication. Here, as examples, the communication channels may conform to standards such as double data rate (DDR), DDR2, DDR3, DDR4, low-power DDR (LPDDR), universal serial bus (USB), multimedia card (MMC), embedded MMC (e-MMC), peripheral component interconnection (PCI), PCI-express (PCI-E), advanced technology attachment (ATA), serial-ATA, Parallel-ATA, small computer small interface (SCSI), enhanced small disk interface (ESDI), integrated drive electronics (IDE), Firewire, universal flash storage (UFS), and non-volatile memory express (NVMe). With respect to the first I/O port 241 and the second I/O port 242, the term "port" broadly refers to an electrical interconnection point for an integrated circuit (IC). Examples of ports include contact pins, pads, and other interconnects.

The memory device 240 may be implemented as a volatile memory device. As mentioned previously, the volatile memory device 240 may be a DRAM. The volatile memory device may also be implemented as random access memory (RAM) or static RAM (SRAM), but the inventive concept is not limited thereto. As examples, the memory device 240 may correspond to DDR synchronous-dynamic RAM (DDR SDRAM), LPDDR SDRAM, graphics DDR (GDDR) SDRAM, or Rambus DRAM (RDRAM). Alternatively, the memory device 260 may be implemented as a high-bandwidth memory (HBM). Further, rather than a volatile memory device, the memory device 260 may be implemented as a non-volatile memory device such as a resistive memory, phase-change RAM (PRAM), magnetic RAM (MRAM), and resistive RAM (RRAM).

The NVM 260 may include a variety of different components, such as a processing unit, a plurality of cores included in the processing unit, a multi-format codec (MFC), a video module processor, a video processor, a three-dimensional (3D) graphics core, an audio system, a driver, a display driver, a volatile memory, a non-volatile memory, a memory controller, an input/output (I/O) interface block, and/or a cache memory. In an embodiment, the NVM 260 may include a non-volatile memory system including a non-volatile memory device and a non-volatile memory controller. In an embodiment, the NVM 260 may include some volatile memory.

The NVM 260 may communicate data with the memory device 240 based on the NVM command signal ICMD generated by the RCD 220. For example, in response to the NVM command signal ICMD, the NVM 260 may transmit data through the data line LDQ to the memory device 240 or receive data through the data line LDQ from the memory device 240. In an embodiment, the NVM 260 may provide the second command signal CMD2 to the RCD 220, but the inventive concept is not limited thereto. In another embodiment, the NVM 260 may not provide a command to the RCD 220.

The memory device 240 according to an example embodiment may transmit or receive data through the first I/O port 241 and/or the second I/O port 242 based on the memory command signal MCMD. In an embodiment, each of the first I/O port 241 and the second I/O port 242 may be put in a data transmission state, a data reception state, or a floating state. Here, the data transmission state may indicate a state in which the memory device 240 transmits data through a port to an external device, and the data reception state may indicate a state in which the memory device 240 receives data through a port. Here, the floating state may indicate a case in which a corresponding port is not used or is in an electrically open state. In an example embodiment, a state of each of the first I/O port 241 and the second I/O port 242 may be determined based on the memory command signal MCMD. Combinations of a state of the first I/O port 241 and a state of the second I/O port 242 will be described later in the context of example embodiments with reference to FIGS. 5A to 10B.

In an embodiment, the memory device 240 may further include control logic, an operational example of which is described later with reference to FIG. 4. The control logic may be circuitry that controls an operation of the memory device 240 based on the memory command signal MCMD. In addition, the control logic may control the input and/or output of data via the first I/O port 241 and/or the second I/O port 242 based on the memory command signal MCMD.

Figure 2:
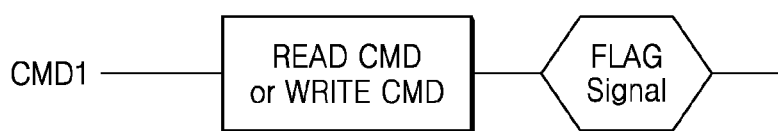
FIG. 2 is a diagram of a first command signal according to an example embodiment.

FIG. 2 is a diagram for reference in explaining a first command signal CMD1 according to an example embodiment. FIG. 2 will be described with concurrent reference to FIG. 1.

In an embodiment, the first command signal CMD1 may be a digital signal including a data operation command and a flag signal. For example, the data operation command may include a read command or a write command. The flag signal may indicate a transfer mode of the memory device 240 as one among a plurality of transfer modes. The memory device 240 may perform data communication through the first I/O port 241 and/or the second I/O port 242 according to a transfer mode indicated by the flag signal. Various embodiments in which the memory device 240 performs a data operation based on the data operation command and the flag signal will be described later with reference to FIGS. 5A to 10B.

In an embodiment, the host 100 may provide the first command CMD1 to the sub-memory system 200 through the command/address line. In this case, in an embodiment, the host 100 may provide the flag signal through an unused pin of address pins.

Figure 3:
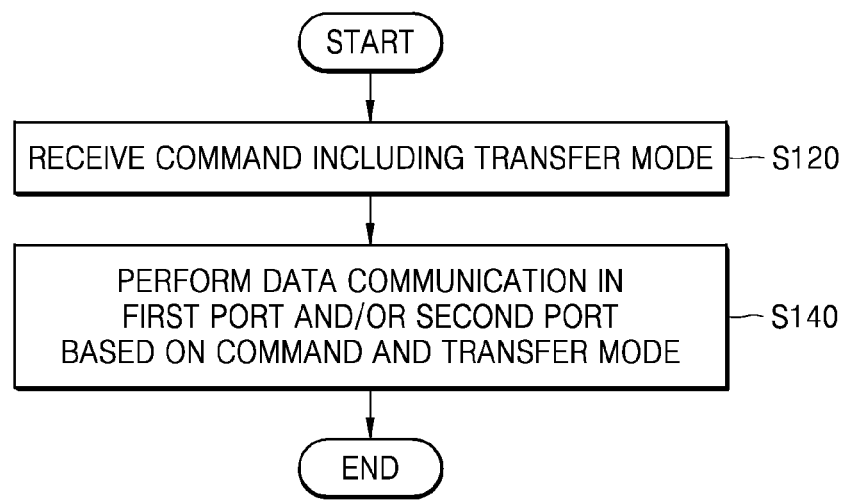
FIG. 3 is a flowchart for reference in describing a method of operating a sub-memory system according to an example embodiment.

FIG. 3 is a flowchart for reference in describing a method of operating a sub-memory system 200 according to an example embodiment.

Referring collectively to FIGS. 1 and 3, the sub-memory system 200 may receive an externally supplied first command signal CMD1 including a command and a flag signal indicative of a transfer mode (S120). Alternatively, for example, data indicative of the transfer mode may be embedded in the command of the first command signal CMD1, or a signal indicative of the transfer mode may be separately transmitted. The command may be a read/write command. One example of a read/write command is a command for flushing data from the memory device 240 to the NVM 260.

Next, the memory device 240 included in the sub-memory system 200 is operated in accordance with the command and the transfer mode to carry out data communication using at least one of the first I/O port 241 and the second I/O port 242 (S140). For example, an operation of the memory device 240 may be responsive to the internal memory command signal MCMD generated by the RCD 220 based on the transfer mode of the first command signal CMD1.

Figure 4:
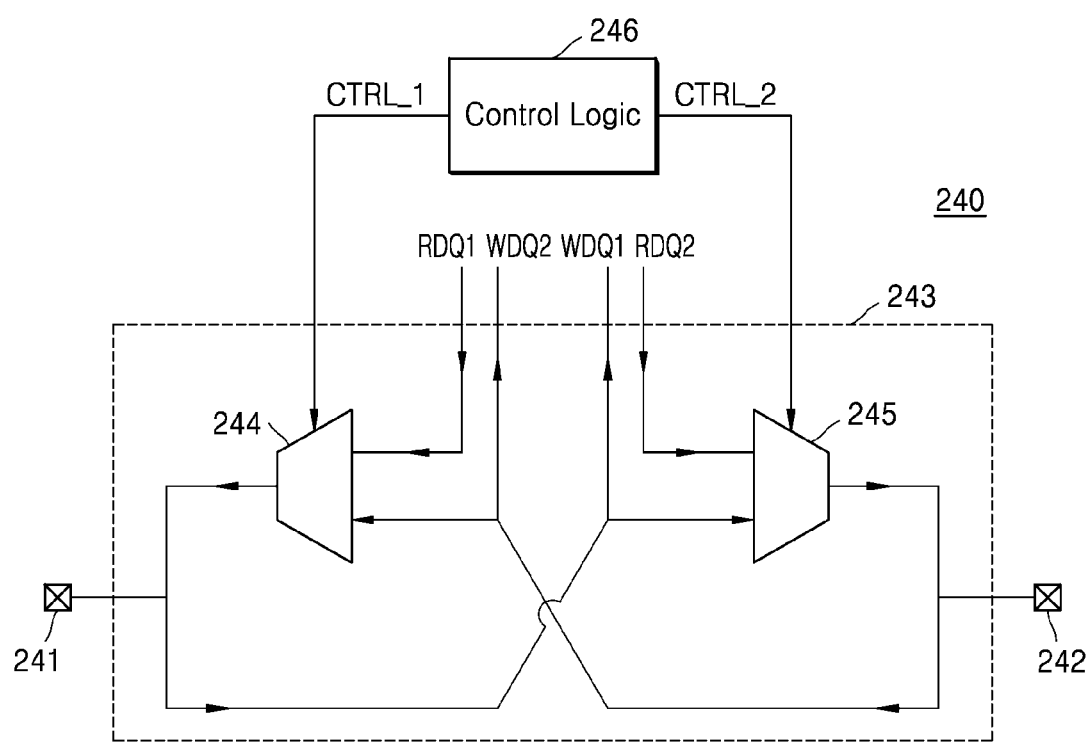
FIG. 4 is a diagram of a memory device according to an example embodiment.

FIG. 4 is a schematic diagram of a multiplexer 243 and control logic 246 of the memory device 240 according to an example embodiment.

The multiplexer 243 as configured in FIG. 4 is a non-limiting example of a data path generating circuit configured to selectively form a first data path between memory cells of the memory device 240 and the first I/O port 241, a second data path between the memory cells of the memory device 240 and the second I/O port 242, and a third data path between the first I/O port 241 and the second I/O port 242 that bypasses the memory cells of the memory device 240.

Referring collectively to FIGS. 1 and 4, the memory device 240 of this example includes the first I/O port 241, the second I/O port 242, a multiplexer 243, and control logic 246.

The control logic 246 may control an overall operation of the memory device 240, including operations not expressly described herein. In the context of operations relating to FIG. 4, the control logic 246 controls the multiplexer 243 by generating a first control signal CTRL_1 and a second control signal CTRL_2. As will be described later in the context of multiple examples of different transfer modes, the first control signal CTRL_1 and second control signal CTRL_2 are generated by the control logic 246 in response to the internal memory command signal MCMD which is based on the read/write command and transfer mode of the first command signal CMD1.

The multiplexer 243 may selectively form a data transmission path among an internal data line of the first I/O port 241, an internal data line of the second I/O port 242, and at least one of internal data lines connected to internal memory components of the memory device 240. The internal data lines connected to the internal memory components may include a first read data line RDQ1 for transmitting first read data RDQ1, a second read data line RDQ2 for transmitting second read data RDQ2, a first write data line WDQ1 for transmitting first write data WDQ1, and a second write data line WDQ2 for transmitting second write data WDQ2.

In the example of FIG. 4, the multiplexer 243 includes a first switching device 244 responsive to the first control signal CTRL_1 for selectively outputting one of two inputs, and a second switching device 245 responsive to the second control signal CTRL_2 for selectively outputting one of two inputs. However, the inventive concepts are not limited to the specific configuration of FIG. 4, and other circuits may be adopted for realizing the same general functionality. The first and second switching devices 244 and 245 may also be referred to as multiplexer circuits.

One input of the first switching device 244 is coupled to the internal data line RDQ1, and the other input of the first switching device 244 is coupled to the internal data line of the second I/O port 242. The output of the first switching device 244 is coupled to the internal data line of the first I/O port 241.

In a similar fashion, one input of the second switching device 245 is coupled to the internal data line RDQ2, and the other input of the second switching device 244 is coupled to the internal data line of the first I/O port 241. The output of the second switching device 244 is coupled to the internal data line of the second I/O port 242. As such, the first write data RDQ1 may be transmitted to the host 100 through the first switching device 244 and the first I/O port 241, and the second write data RDQ2 may be transmitted to the NVM 260 through the second switching device 245 and the second I/O port 242.

In addition, the first write data line WDQ1 is coupled to the first I/O port 241, and the second write data line WDQ2 is coupled to the second I/O port 242. As such, data received at the first I/O port 241 from the host 100 may be written to memory cells of the memory device 240 through the first write data line WDQ1, or outputted on the second I/O port 242 to the NVM 260 through the second switching device 245. Likewise, data received at the second I/O port 241 from the NVM may be written to memory cells of the memory device 240 through the second write data line WDQ2, or outputted on the first I/O port 241 to the host 100 through the first switching device 244.

The operation in which data is transmitted from the first I/O port 241 to the second I/O port 242 through the second switching device 245 may be referred to as a bypass operation since the data is transmitted from the host 100 to the NVM 260 without being stored in memory cells of the memory device 240. Also, the operation in which data is transmitted from the second I/O port 242 to the first I/O port 241 through the first switching element 244 may also be referred to as a bypass operation since the data is transmitted from the NVM 260 to the host 100 without being stored in memory cells of the memory device 240.

Methods of performing data communication based on different transfer modes will now be described with reference to FIGS. 5A, 5B, 6A, 6B, 7A, 7B, 8A, 8B, 9, 10A and 10B.

Figure 5A:
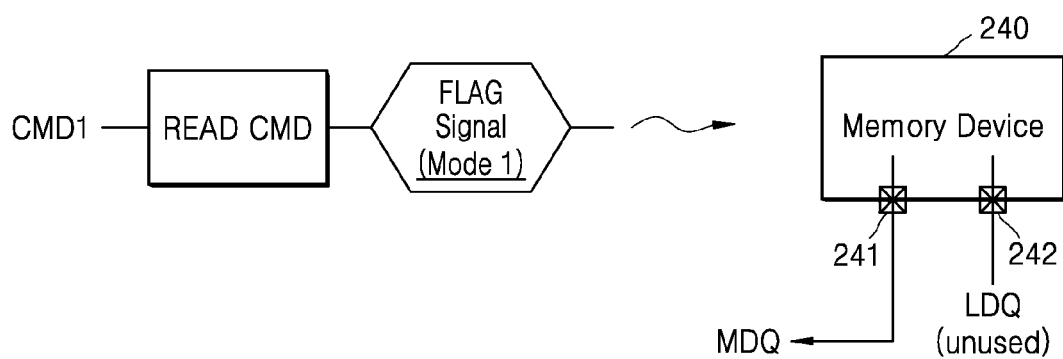
FIGS. 5A and 5B are diagrams showing a first command signal and a data communication method of a memory device according to an example embodiment.
Figure 5B:
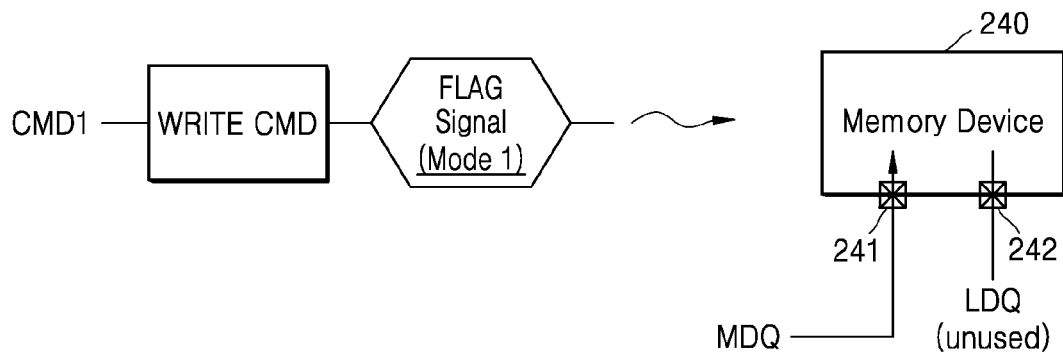

FIGS. 5A and 5B are diagrams for reference in describing data transfer in a case where the flag signal of the first command signal CMD1 is indicative of a first transfer mode.

Referring collectively to FIGS. 1, 4 and 5A, the first command signal CMD1 received from the host 100 by the RCD 220 of the sub-memory system 200 includes a read command and a flag signal indicating a first transfer mode. Here, the flag signal indicative of the first transfer mode may be '000', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the first transfer mode, the RCD 220 generates an internal memory command MCMD which cause the memory device 240 to place the first I/O port 241 in a data transmission state and the second I/O port 242 in a floating (or unused) state. Also, since the command is a read command, the control logic 246 of the memory device 240 is responsive to the internal memory command MCMD to generate a first control signal CTRL_1 that causes the first switching device 244 to select the first read data line RDQ1. In this way, first read data RDQ1 may be transmitted to the host 100 through the first switching device 244 and the first I/O port 241. It will be understood that the first read data RDQ1 is read according to a memory address included with or transmitted separately from the first command signal CMD1 by the host 100.

Referring collectively to FIGS. 1, 4 and 5B, the first command signal CMD1 received from the host 100 by the RCD 220 of the sub-memory system 200 includes a write command and a flag signal indicating the first transfer mode.

As in the previous example relating to FIG. 5A, in response to the indication of the first transfer mode, the RCD 220 generates an internal memory command MCMD which cause the memory device 240 to place the first I/O port 241 in a data reception state and the second I/O port 242 in a floating (or unused) state. Also, it is assumed here that the write command is a write to the memory device 240. In this case, the write data from the host 100 is transmitted from the first I/O port 241 to the first write data line WDQ1 to be stored in memory cells of the memory device 240. The first and second switching devices 244 and 245 are not used in this instance. It will be understood that the write data is stored in the memory device 240 at a memory address included with or transmitted separately from the first command signal CMD1 by the host 100.

Figure 6A:
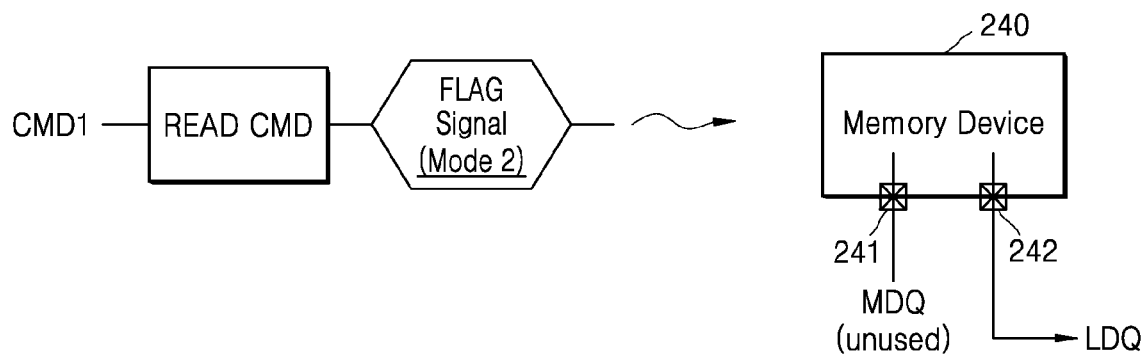
FIGS. 6A and 6B are diagrams showing a first command signal and a data communication method of a memory device according to an example embodiment.
Figure 6B:
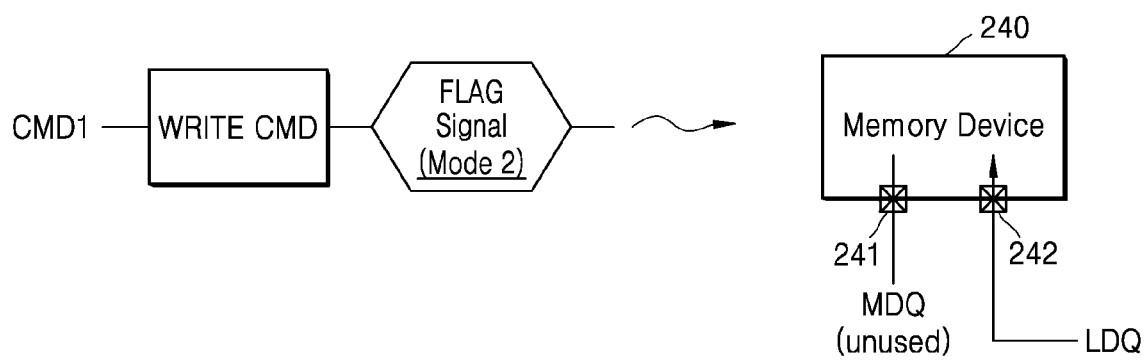

FIGS. 6A and 6B are diagrams for reference in describing data transfer in a case where the flag signal of the first command signal CMD1 is indicative of a second transfer mode.

Referring collectively to FIGS. 1, 4 and 6A, in this example the first command signal CMD1 received from the host 100 by the RCD 220 of the sub-memory system 200 includes a read command and a flag signal indicating a second transfer mode. Here, the flag signal indicative of the second transfer mode may be '001', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the second transfer mode, the RCD 220 generates an internal memory command MCMD which cause the memory device 240 to place the second I/O port 242 in a data transmission state and the first I/O port 241 in a floating (or unused) state. Also, since the command is a read command, the control logic 246 of the memory device 240 is responsive to the internal memory command MCMD to generate a second control signal CTRL_2 that causes the second switching device 245 to select the second read data line RDQ2. In this way, second read data RDQ2 may be transmitted to the NVM 260 through the second switching device 245 and the second I/O port 242. It will be understood that the second read data RDQ1 is read according to a memory address included with or transmitted separately from the first command signal CMD1 by the host 100.

Referring collectively to FIGS. 1, 4 and 6B, in this example the first command signal CMD1 received from the host 100 by the RCD 220 of the sub-memory system 200 includes a write command and a flag signal indicating the second transfer mode.

As in the previous example relating to FIG. 6A, in response to the indication of the second transfer mode, the RCD 220 generates an internal memory command MCMD which cause the memory device 240 to place the second I/O port 242 in a data reception state and the first I/O port 24 in a floating (or unused) state. Also, it is assumed here that the write command is a write to the memory device 240. In this case, the write data from the NVM 260 is transmitted from the second I/O port 242 to the second write data line WDQ2 to be stored in memory cells of the memory device 240. The first and second switching devices 244 and 245 are not used in this instance. It will be understood that the write data is stored in the memory device 240 at a memory address included with or transmitted separately from the first command signal CMD1 by the host 100.

Figure 7A:
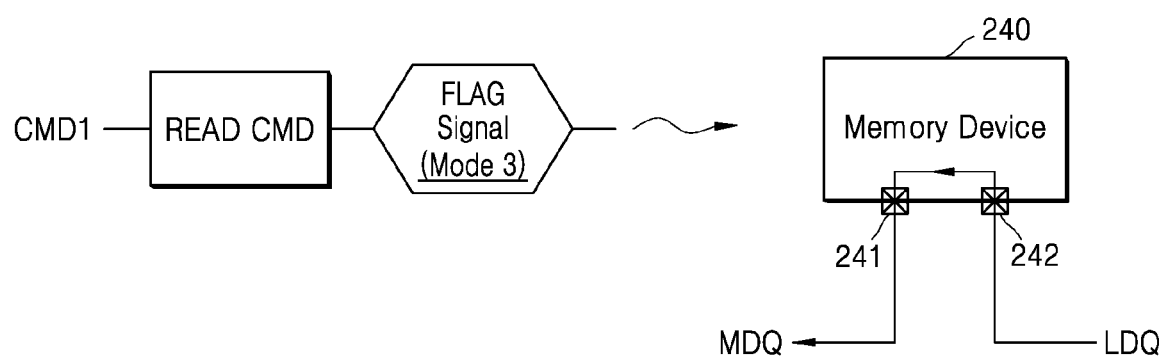
FIGS. 7A and 7B are diagrams showing a first command signal and a data communication method of a memory device according to an example embodiment.
Figure 7B:
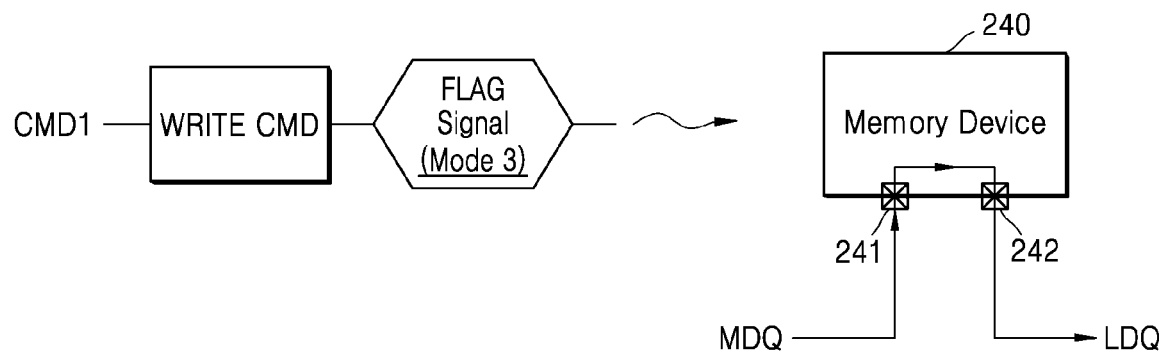

FIGS. 7A and 7B are diagrams for reference in describing data transfer in a case where the flag signal of the first command signal CMD1 is indicative of a third transfer mode. This third transfer mode may be referred to as a bypass mode, since data is not read from or written to memory cells of the memory device 240.

Referring collectively to FIGS. 1, 4 and 7A, in this example the first command signal CMD1 received from the host 100 by the RCD 220 of the sub-memory system 200 includes a read command and a flag signal indicating a third transfer mode. Here, the flag signal indicative of the third transfer mode may be '010', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the third transfer mode, the RCD 220 generates an internal memory command MCMD which cause the memory device 240 to place the first I/O port 241 in a data transmission state and the second I/O port 242 in a data reception state. Also, since the command accompanying the third transfer mode is a read command, the control logic 246 of the memory device 240 is responsive to the internal memory command MCMD to generate a first control signal CTRL_1 that causes the first switching device 244 to select the second I/O port 242. In addition, the control logic 246 transmits an NVM command signal ICMD to the NVM 260 to cause the NVM 260 to transmit read data on the internal data line LDQ. In this way, read data on the internal data line LDQ of the NVM 260 may be transmitted to the host 100 through the second port I/O 242, the first switching device 244 and the first I/O port 241 of the memory device 240. The read data may be transmitted from the NVM 260 to the host 100 without being stored in memory cells of the memory device 240. That is, the memory cells of the memory device 240 may be bypassed. It will be understood that the read data is read according to a memory address included with or transmitted separately from the first command signal CMD1 by the host 100.

Referring collectively to FIGS. 1, 4 and 7B, in this example the first command signal CMD1 received from the host 100 by the RCD 220 of the sub-memory system 200 includes a write command and a flag signal indicating the third transfer mode.

In response to the indication of the third transfer mode, the RCD 220 generates an internal memory command MCMD which cause the memory device 240 to place the first I/O port 241 in a data reception state and the second I/O port 242 in a data transmission state. Also, since the command accompanying the third transfer mode is a write command, the control logic 246 of the memory device 240 is responsive to the internal memory command MCMD to generate a second control signal CTRL_1 that causes the second switching device 245 to select the second I/O port 242. In addition, the control logic 246 transmits an NMV command signal ICMD to the NVM 260 to cause the NVM 260 to write data transmitted on the internal data line LDQ. In this way, write data on the external data line MDQ of the host 100 may be transmitted to the NVM 260 through the first port I/O 241, the second switching device 245 and the second I/O port 242 of the memory device 240. The write data may be transmitted from the host 100 to the NVM 260 without being stored in memory cells of the memory device 240. That is, the memory cells of the memory device 240 may be bypassed. It will be understood that the write data is written according to a memory address included with or transmitted separately from the first command signal CMD1 by the host 100.

Figure 8A:
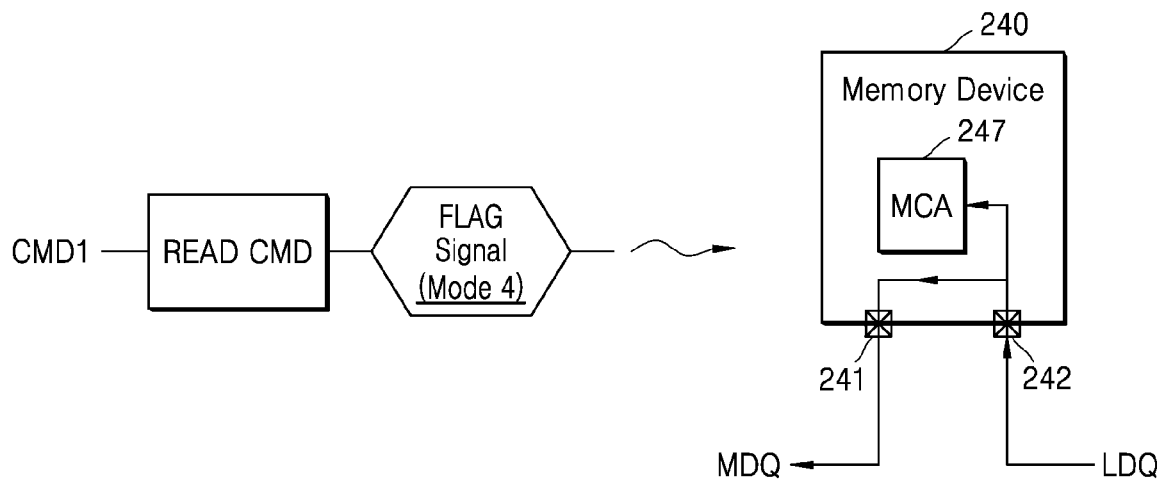
FIGS. 8A and 8B are diagrams showing a first command signal and a data communication method of a memory device according to an example embodiment.
Figure 8B:
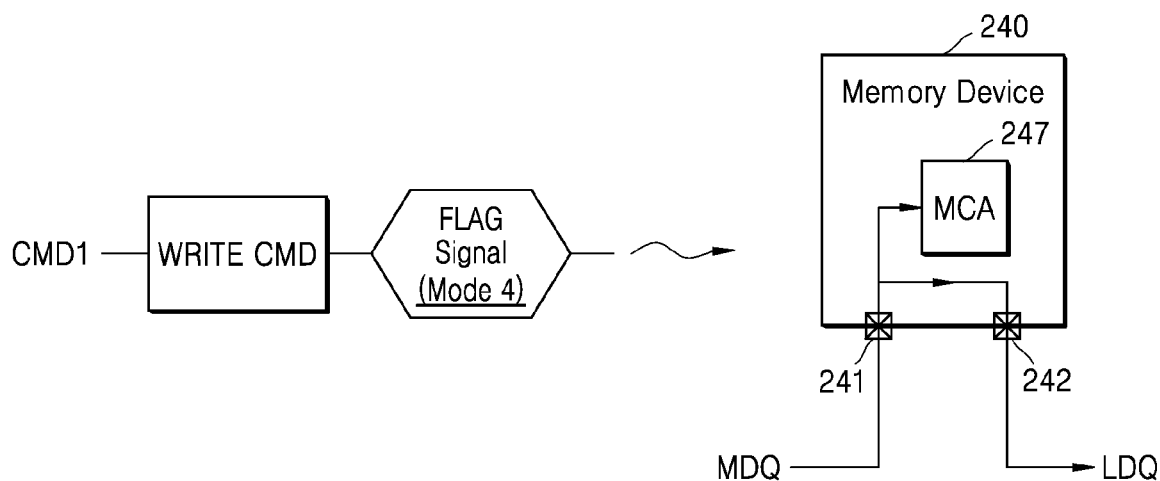

FIGS. 8A and 8B are diagrams for reference in describing data transfer in a case where the flag signal of the first command signal CMD1 is indicative of a fourth transfer mode. This fourth transfer mode may be considered a modification of the previously described third transfer mode. That is, data read from and written to the NVM 260 by the host 100 is both bypassed at the memory device 240 and also written to memory cells of a memory cell array (MCA) 247 of the memory device 240. The MCA 247 of the figures represents one or more memory cell arrays of the memory device 240, and is operatively coupled to the first and second read data lines RDQ1 and RDQ2 and the first and second write data lines WDQ1 and WDQ2 shown in FIG. 4.

Referring collectively to FIGS. 1, 4 and 8A, in this example the first command signal CMD1 received from the host 100 by the RCD 220 of the sub-memory system 200 includes a read command and a flag signal indicating a fourth transfer mode. Here, the flag signal indicative of the fourth transfer mode may be '011', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the fourth transfer mode, the RCD 220 generates an internal memory command MCMD which causes the memory device 240 to place the first I/O port 241 in a data transmission state and the second I/O port 242 in a data reception state. Also, since the command accompanying the fourth transfer mode is a read command, the control logic 246 of the memory device 240 is responsive to the internal memory command MCMD to generate a first control signal CTRL_1 that causes the first switching device 244 to select the second I/O port 242. In addition, the RCD 220 transmits an NVM command signal ICMD to the NVM 260 to cause the NVM 260 to transmit read data on the internal data line LDQ. In this way, read data on the internal data line LDQ of the NVM 260 may be transmitted to the host 100 through the second port I/O 242, the first switching device 244 and the first I/O port 241 of the memory device 240. In addition, the same read data is simultaneously transmitted on the second write data line WDQ2 to be written into the MCA 247 of the memory device 240.

Referring collectively to FIGS. 1, 4 and 8B, in this example the first command signal CMD1 received from the host 100 by the RCD 220 of the sub-memory system 200 includes a write command and a flag signal indicating the fourth transfer mode.

In response to the indication of the fourth transfer mode, the RCD 220 generates an internal memory command MCMD which causes the memory device 240 to place the first I/O port 241 in a data reception state and the second I/O port 242 in a data transmission state. Also, since the command accompanying the fourth transfer mode is a write command, the control logic 246 of the memory device 240 is responsive to the internal memory command MCMD to generate a second control signal CTRL_2 that causes the second switching device 245 to select the first I/O port 241. In addition, the RCD 220 transmits an NVM command signal ICMD to the NVM 260 to cause the NVM 260 to write data transmitted on the internal data line LDQ. In this way, write data on the external data line MDQ of the host 100 may be transmitted to the NVM 260 through the first port I/O 241, the second switching device 245 and the second I/O port 242 of the memory device 240. The write data may be transmitted from the host 100 to the NVM 260 without being stored in memory cells of the memory device 240. In addition, the same read data is simultaneously transmitted on the first write data line WDQ1 to be written into the MCA 247 of the memory device 240.

Figure 9:
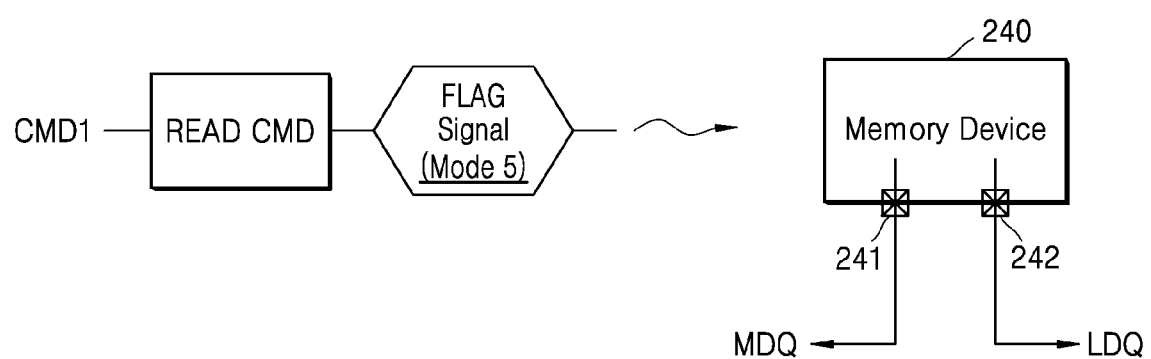
FIG. 9 is a diagram showing a first command signal and a data communication method of a memory device according to an example embodiment.

FIG. 9 is a diagram for reference in describing data transfer in a case where the flag signal of the first command signal CMD1 is indicative of a fifth transfer mode. In this example, read data of the memory device 240 is simultaneously transmitted to host device 100 and the NVM 260.

Referring collectively to FIGS. 1, 4 and 9, in this example the first command signal CMD1 received from the host 100 by the RCD 220 of the sub-memory system 200 includes a read command and a flag signal indicating the fifth transfer mode. Here, the flag signal indicative of the fifth transfer mode may be '100', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the fifth transfer mode, the RCD 220 generates an internal memory command MCMD which causes the memory device 240 to place the first I/O port 241 in a data transmission state and the second I/O port 242 in a data transmission state. Also, since the command accompanying the fifth transfer mode is a read command, the control logic 246 of the memory device 240 is responsive to the internal memory command MCMD to generate a first control signal CTRL_1 that causes the first switching device 244 to select the first read data line RDQ1 and the second switching device 244 to select the second read data line RDQ2. In addition, the RCD 220 transmits an NVM command signal ICMD to the NVM 260 to cause the NVM 260 to write data transmitted on the internal data line LDQ from the memory device 240. First data stored in the memory device 240 is read and transmitted to the host 100 via the first read data line RDQ1, the first switching device 244 and the first I/O port 241. Likewise, second data stored in the memory device 240 is read and transmitted to the NVM 260 via the second read data line RDQ2, the second switching device 245 and the second I/O port 242. The first and second data may be the same data or different data.

Figure 10A:
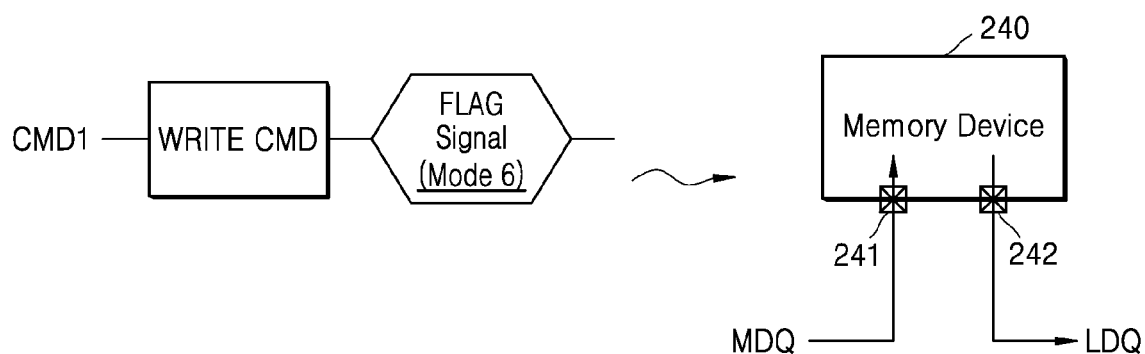
FIGS. 10A and 10B are diagrams showing a first command signal and a data communication method of a memory device according to an example embodiment.
Figure 10B:
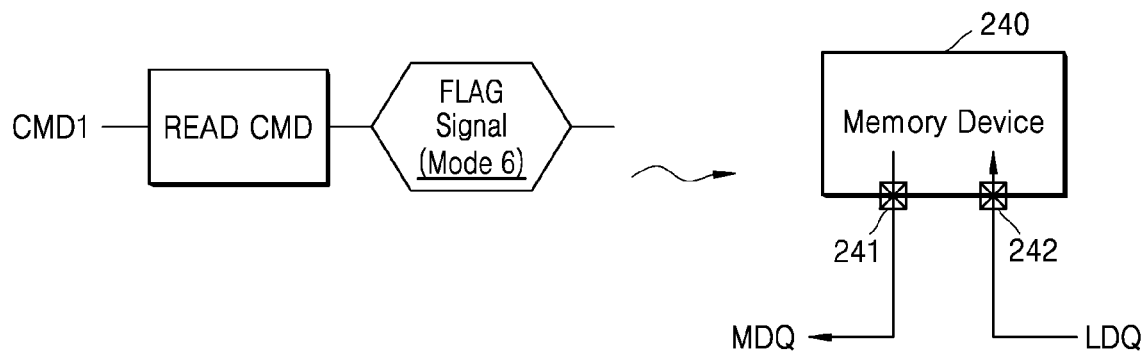

FIGS. 10A and 10B are diagrams for reference in describing data transfer in a case where the flag signal of the first command signal CMD1 is indicative of a sixth transfer mode.

Referring collectively to FIGS. 1, 4 and 10A, in this example the first command signal CMD1 received from the host 100 by the RCD 220 of the sub-memory system 200 includes a write command and a flag signal indicating a sixth transfer mode. Here, the flag signal indicative of the sixth transfer mode may be '101', but the inventive concepts are not limited to the particularities of the flag signal. Instead, the flag signal may be any arbitrary predefined signal such as a predefined n-bit signal (n is a natural number). Alternatively, as previously mentioned, the transfer mode may be embedded in the command, or transmitted separately from the command.

In response to the indication of the sixth transfer mode, the RCD 220 generates an internal memory command MCMD which causes the memory device 240 to place the first I/O port 241 in a data reception state and the second I/O port 242 in a data transmission state. Also, since the command accompanying the sixth transfer mode is a write command, the control logic 246 of the memory device 240 is responsive to the internal memory command MCMD to generate a second control signal CTRL_2 that causes the second switching device 245 to select the second read data line RDQ2. In addition, the RCD 220 transmits an NVM command signal ICMD to the NVM 260 to cause the NVM 260 to write data transmitted on the internal data line LDQ. In operation, write data on the external data line MDQ of the host 100 may be transmitted to and stored in memory cells of the memory device 240 via the first write data line WDQ1 coupled to the first I/O port 241. At the same time, stored data is read from the memory cells of the memory device 240 and transmitted on the second read data line RDQ2. The read data is then transmitted to the NVM 260 through the second switching device 245 and the second port I/O 242. The write data is then written to the NVM 260 in accordance with an NVM command signal ICMD received from the RCD 220. These operations may overlap in time such that data is simultaneously transmitted on the external data line MDQ and the internal data line LDQ.

Referring collectively to FIGS. 1, 4 and 10B, in this example the first command signal CMD1 received from the host 100 by the RCD 220 of the sub-memory system 200 includes a read command and a flag signal indicating the sixth transfer mode.

In response to the indication of the sixth transfer mode, the RCD 220 generates an internal memory command MCMD which causes the memory device 240 to place the first I/O port 241 in a data transmission state and the second I/O port 242 in a data reception state. Also, since the command accompanying the sixth transfer mode is a read command, the control logic 246 of the memory device 240 is responsive to the internal memory command MCMD to generate a first control signal CTRL_2 that causes the first switching device 244 to select the first read data line RDQ2. In addition, the RCD 220 transmits an NVM command signal ICMD to the NVM 260 to cause the NVM 260 to read data and transmit the read data on the internal data line LDQ. In operation, read data on the internal data line LDQ may be transmitted to and stored in memory cells of the memory device 240 via the second write data line WDQ2 coupled to the second I/O port 242. At the same time, write data is read from the memory cells of the memory device 240 and transmitted on the first read data line RDQ1. The read data is then transmitted to the host 100 through the first switching device 244 and the first port I/O 241. These operations may overlap in time such that data is simultaneously transmitted on the external data line MDQ and the internal data line LDQ.

Figure 11:
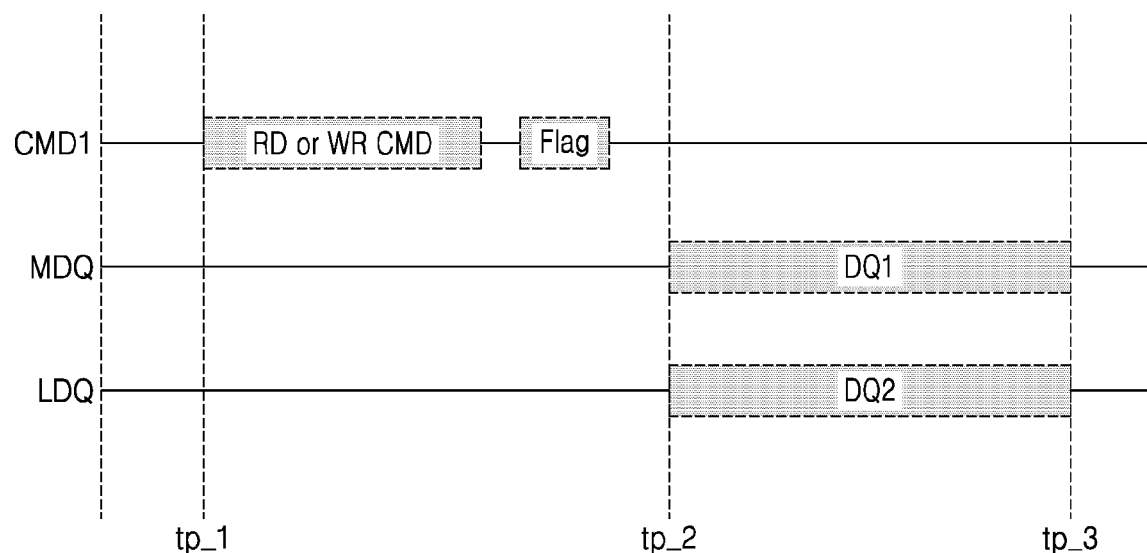
FIG. 11 is a timing diagram for describing a first command signal and data signals of a first I/O port and a second I/O port according to an example embodiment.

FIG. 11 is a timing diagram for reference in describing a timing of first command signal CMD1 and data signals MDQ and LDQ of the first I/O port 241 and 242 in an example embodiment. In this embodiment, data is at least partially simultaneously transmitted on the data lines MDQ and LDQ. Such may occur, for example, in the fifth and sixth transfer modes described above in connection with FIGS. 9, 10A and 10B.

Referring collectively to FIGS. 1 and 11, the sub-memory system 200 may receive a flag signal along with a data operation command (i.e., a read command or a write command) as a first command signal CMD1 during an interval between a first time point tp_1 and a second time point tp_2.

In response to the first command signal CMD1, the memory device 240 may transmit or receive first data DQ1 through the data line MDQ in a time period between the second time point tp_2 and a third time point tp_3.

Also in response to the first command signal CMD1, the memory device 240 may transmit or receive second data DQ2 through the data line LDQ during at least a portion of the time period in which the first data DQ1 is communicated. Although FIG. 11 illustrates the second data DQ2 being communicated during the same time period as the first data DQ1 between the second time point tp_2 and the third time point tp_3, the inventive concept is not limited thereto. For example, the time duration during which the first data DQ1 is communicated may only partially overlap the time duration during which the second data DQ2 is communicated.

Figure 12:
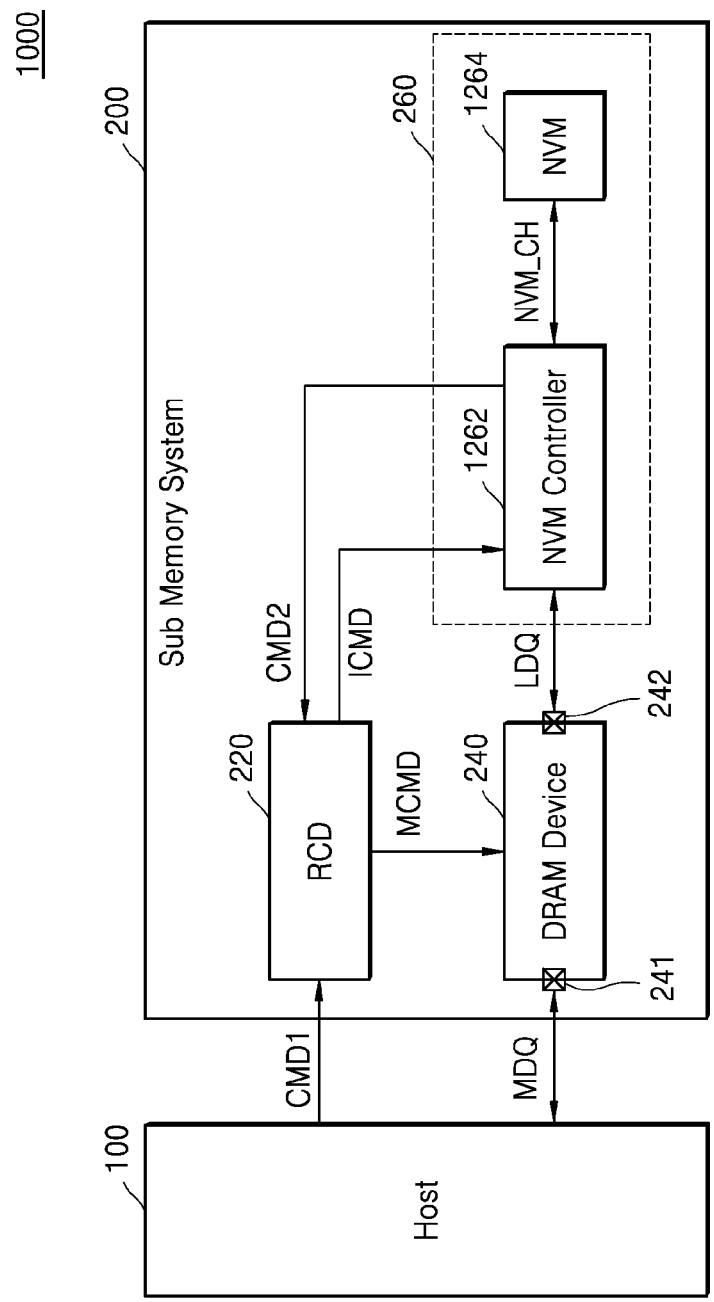
FIG. 12 is a diagram of a data processing system according to an example embodiment.

FIG. 12 is a schematic diagram of a data processing system 1000 according to an example embodiment. The embodiment of FIG. 12 is the same as that of FIG. 1, except that an example of additional details of the NVM 260 are shown, and the memory device 240 is illustrated as a DRAM device. Thus, like elements are depicted with like reference numbers in FIGS. 1 and 12, and a duplicative description of such elements is omitted here to avoid redundancy.

Referring to FIG. 12, the NVM system 260 includes an NVM controller 1262 and NVM device 1264 connected by NVM channels NVM_CH.

The NVM controller 1262 may control the NVM device 1264. The NVM controller 1262 may communicate data with the DRAM device 240 based on an NVM command signal ICMD. For example, the NVM controller 1262 may transmit data through a data line LDQ to the DRAM device 240 or receive data through the data line LDQ from the DRAM device 240. In an embodiment, the NVM controller 1262 may provide a second command CMD2 to the RCD 220, but the inventive concept is not limited thereto. In another embodiment, the NVM controller 1262 may not provide a command to the RCD 220.

The NVM device 1264 may be connected to the NVM controller 1262 through the NVM channel NVM_CH. The NVM device 1264 may include flash memory. The NVM device 1264 may write data or read data under control of the NVM controller 1262. As an example, the NVM device 1264 may include at least one of various NVM devices, such as electrically erasable and programmable read-only memory (EEPROM), NAND flash memory, NOR flash memory, phase-change RAM (PRAM), resistive RAM (Re-RAM), ferroelectric RAM (FRAM), and spin-torque magnetic RAM (STT-MRAM).

Figure 13:
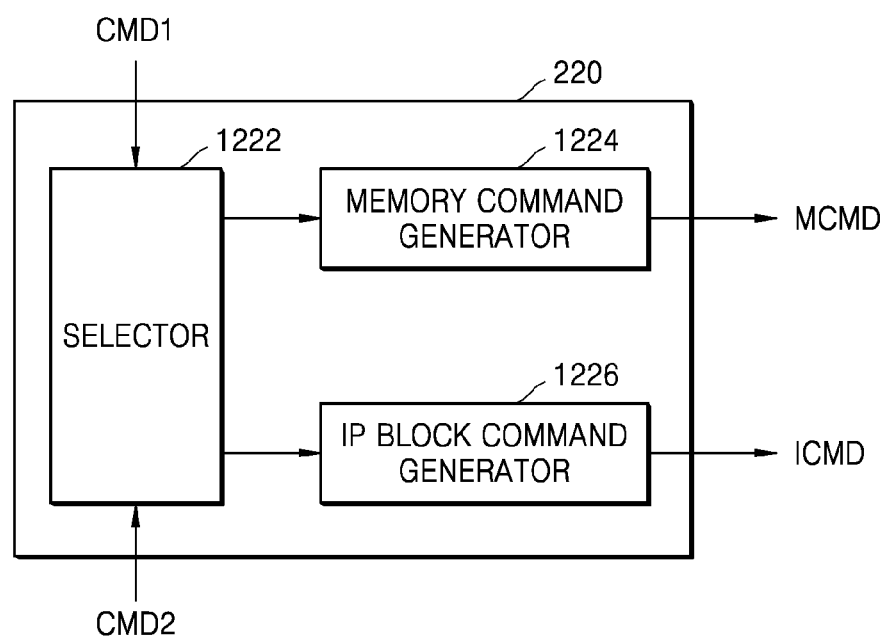
FIG. 13 is a diagram of a register clock driver according to an example embodiment.

FIG. 13 is a schematic diagram of a register clock driver (RCD) 220 of FIGS. 1 and 12 according to an example embodiment. The RCD 220 may include a selector 1222, a memory command generator 1224, and an NVM command generator 1226. The RCD 220 of FIG. 13 will be described with additional reference to FIGS. 1 and 12.

The selector 1222 may select at least one of a first command signal CMD1 provided by the host 100 and a second command signal CMD2 provided by the NVM 260 and provide the at least one selected command to the memory command generator 1224 and the NVM command generator 1226.

The memory command generator 1224 may generate a memory command signal MCMD based on the at least one selected command. The memory command generator 1224 may provide the memory command signal MCMD to the memory device 240.

The NVM command generator 1226 may generate an NVM command signal ICMD signal based on the at least one selected command. The NVM command generator 1226 may provide the NVM command signal ICMD to the NVM 260.

Figure 14:
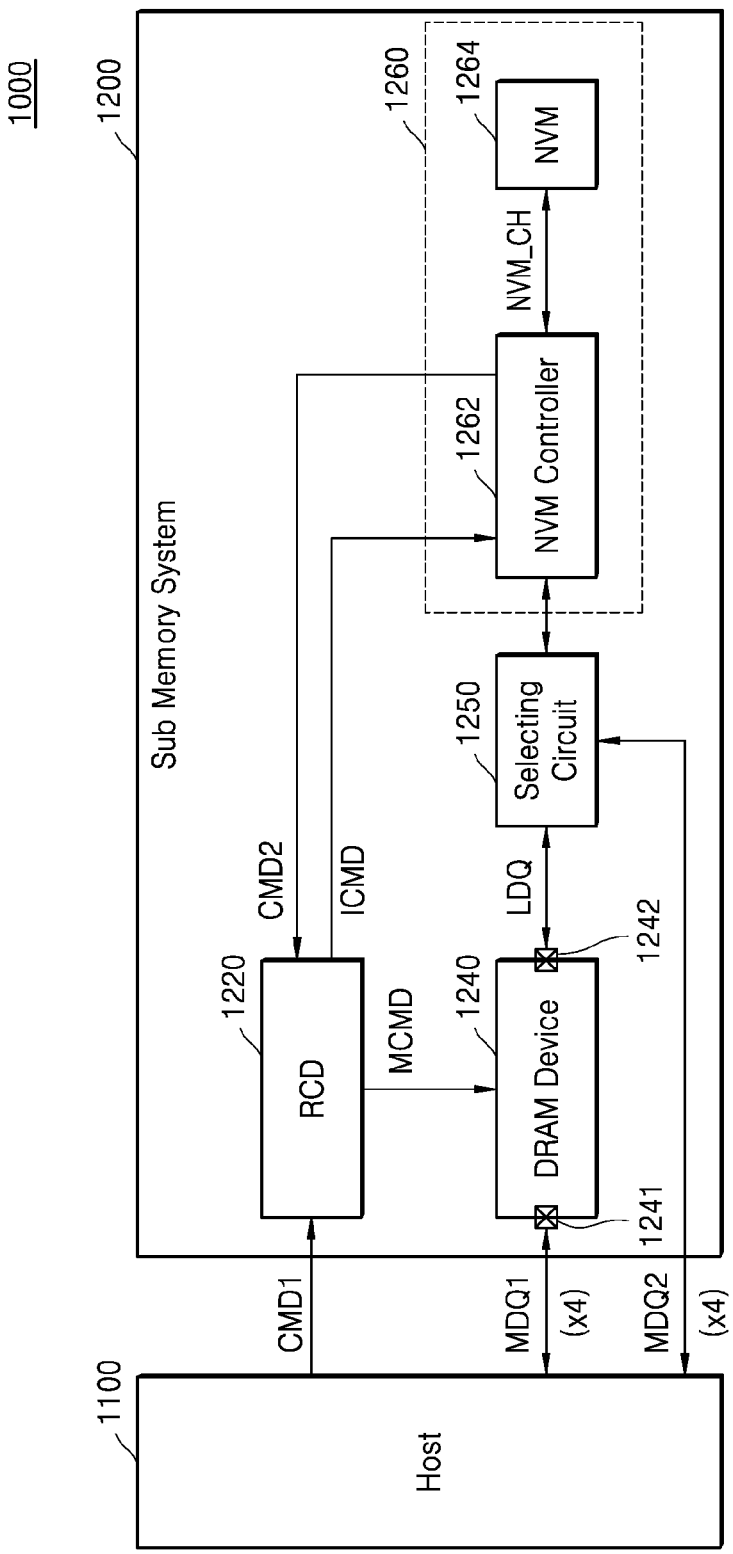
FIG. 14 is a diagram of a data processing system 1000 according to an example embodiment.

FIG. 14 is a diagram of a data processing system 1000 according to an example embodiment.

The data processing system 1000 may include a host 1100 and a sub-memory system 1200. The sub-memory system 1200 may include an RCD 1220, a DRAM device 1240, a selecting circuit 1250, and an NVM system 1260. The RCD 1220, the NVM 1260 and the DRAM 1240 are the same as or similar to like-named components of the previous embodiments, and thus a detailed description of these elements is omitted here to avoid redundancy.

The data processing system 1000 of FIG. 14 is at least partially characterized by a selecting circuit 1250 for emulating a communication mode with the host 1100 at a bit width which is greater than a bit width between the DRAM device 1240 and the host. For example, assume the DRAM device 1240 has eight (8×) data pins, four of which constitute the first I/O port 1241 and four of which constitute the second I/O port 1242. In this case, the host 1100 performs data communication with the DRAM 1240 in an ×4 mode. The selecting circuit 1250 selectively connects the NVM 1260 to a data line MDQ2 of the host rather than to the data line LDQ to the DRAM device 1240. Assuming the data line MDQ2 to be four bits wide, this allows for the host to selectively perform data communication in an ×4 mode through the data line MDQ1 or to perform data communication in an ×8 mode through the data line MDQ1 and the data line MDQ2. It is noted that the number of pins, such as '4' and '8,' is merely an example, and the inventive concept is not limited thereto.

Figure 15A:
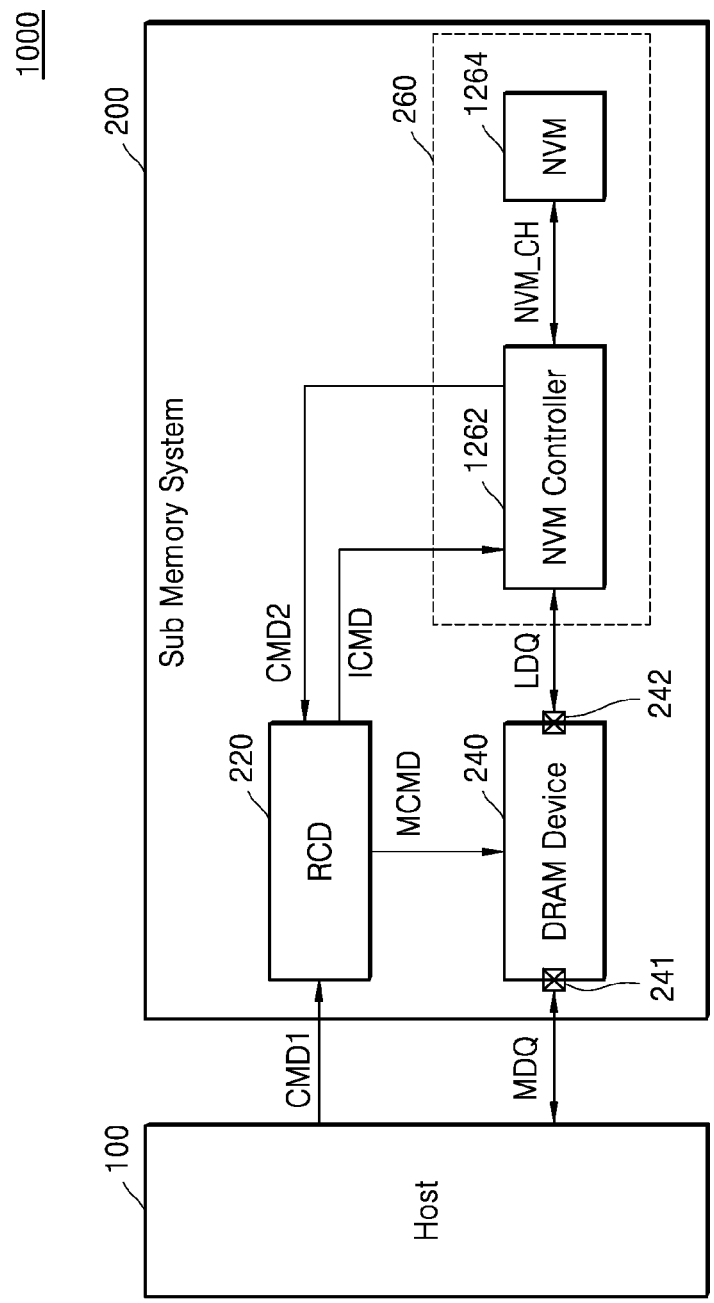
FIGS. 15A and 15B are a schematic diagram and a timing diagram, respectfully, for reference in describing a method of operating a data processing system according to an embodiment of the inventive concepts.
Figure 15B:
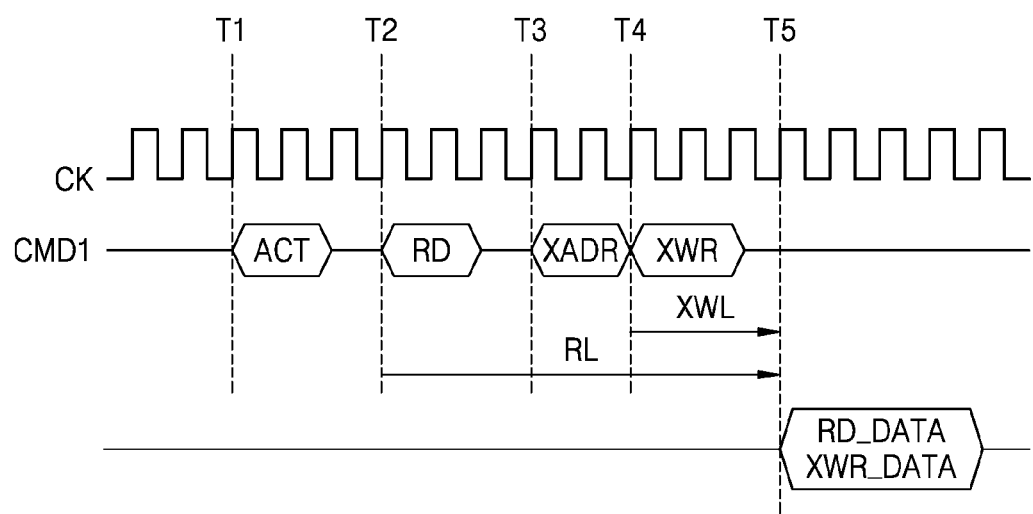

FIGS. 15A and 15B are a schematic diagram and a timing diagram, respectfully, for reference in describing a method of operating a data processing system according to an embodiment of the inventive concepts. The processing system 1000 of FIG. 15A is shown adjacent the timing diagram 15B for convenience and is the same as that shown in previously described FIG. 12.

FIG. 15B illustrates an exemplary timing diagram of a data flush from the DRAM device 240 to the NVM device 1264. It will be understood that such an operation requires a read operation of the DRAM device 240 and a write operation to the NVM 1264. In FIG. 15B, CK denotes a clock signal, and T1 through T5 denote successive periods in time.

Initially, at time T1, the host 100 transmits an activate command ACT as the command signal CMD1 to the sub-memory system 200, and the sub-memory system 200 is activated as a result.

Next, at time T2, the host 100 transmits a read command RD as the command signal CMD1 to the sub-memory system 200. In addition, although not shown, the command signal CMD1 includes a flag signal denoting a transfer mode. For example, the transfer mode may be the second transfer mode which places the second I/O port 242 in a data transmission state as described previously in connection with FIG. 6A. In response, the RCD 220 transmits an internal read command (at MCMD) to the DRAM device 1240.

Next, at time T3, the host 100 transmits a write address XADR followed at time T4 by a write command XWR. As a result, the RCD 220 transmits an internal write command (at ICMD) to the NVM controller of the NVM 260.

Next, at time T5, read data (RD_DATA) is transmitted from the DRAM device 1240 through the second I/O port 242 and the data line LDQ as write data (XWR_DATA) stored in the NVM controller 1262 of the NVM 260 according to the internal read and write commands.

As described above, the internal read command to the DRAM device 240 is transmitted a period of time before the internal write command to the NVM controller 1262 is transmitted. According to an embodiment, this difference in time period corresponds to a difference between a read latency (RL) of the DRAM device 240 and a write latency (XWL) of the NVM 260. In the example of FIG. 15B, the read latency RL of the DRAM device 240 is the period between time T2 and T5 (e.g., 8 clocks), and the write latency XWL is the period between time T4 and T5 (e.g., 3 clocks). The difference between the read latency RL and the write latency XWL is the time period between T2 and T4 (e.g., 5 clocks). As such, in an embodiment, the internal write command XWR is transmitted to the NVM controller 1262 a period of time after the internal read command is transmitted to the DRAM device 240, where the period of time corresponds to the difference between the latency RL and the latency XWL.

It is noted here that writing data to the NVM 260 may require two write operations. A first write operation is from the DRAM device 240 to a buffer of the NVM controller 1252, and a second write operation is from the NVM controller 1252 to the NVM device 1264. The write latency XWL referred to above in connection with FIG. 15B is that of the first write operation to the NVM controller.

Advantageously, the data bus of the host 100 is unoccupied during the operation described above in connection with FIGS. 15A and 15B. That is, the data is transferred directly between the DRAM device 240 and the NVM 260.

In the case of transferring data from the NMV 260 to the DRAM 240, that it may be desirable to have separate commands for transferring data from the NVM device 1264 to the NVM controller 1262, and then for transferring data from the NVM controller 1262 to the DRAM 240. That is, in such an operation, data may be read from the NVM and stored in the NVM controller in response to the first command from the host 100, and then a ready signal may be externally transmitted to the host 100. Then, in response to a second command from the host, an internal read command may be transmitted to the NVM controller, and internal write command may be transmitted to the DRAM a period of time after transmitting the internal read command to the NVM controller. Then, the data may be transferred from the NVM controller to the DRAM in response to the internal read and write commands. Here, the period of time may correspond to a difference between a read latency of the NVM controller and a write latency of the DRAM.

Figure 16A:
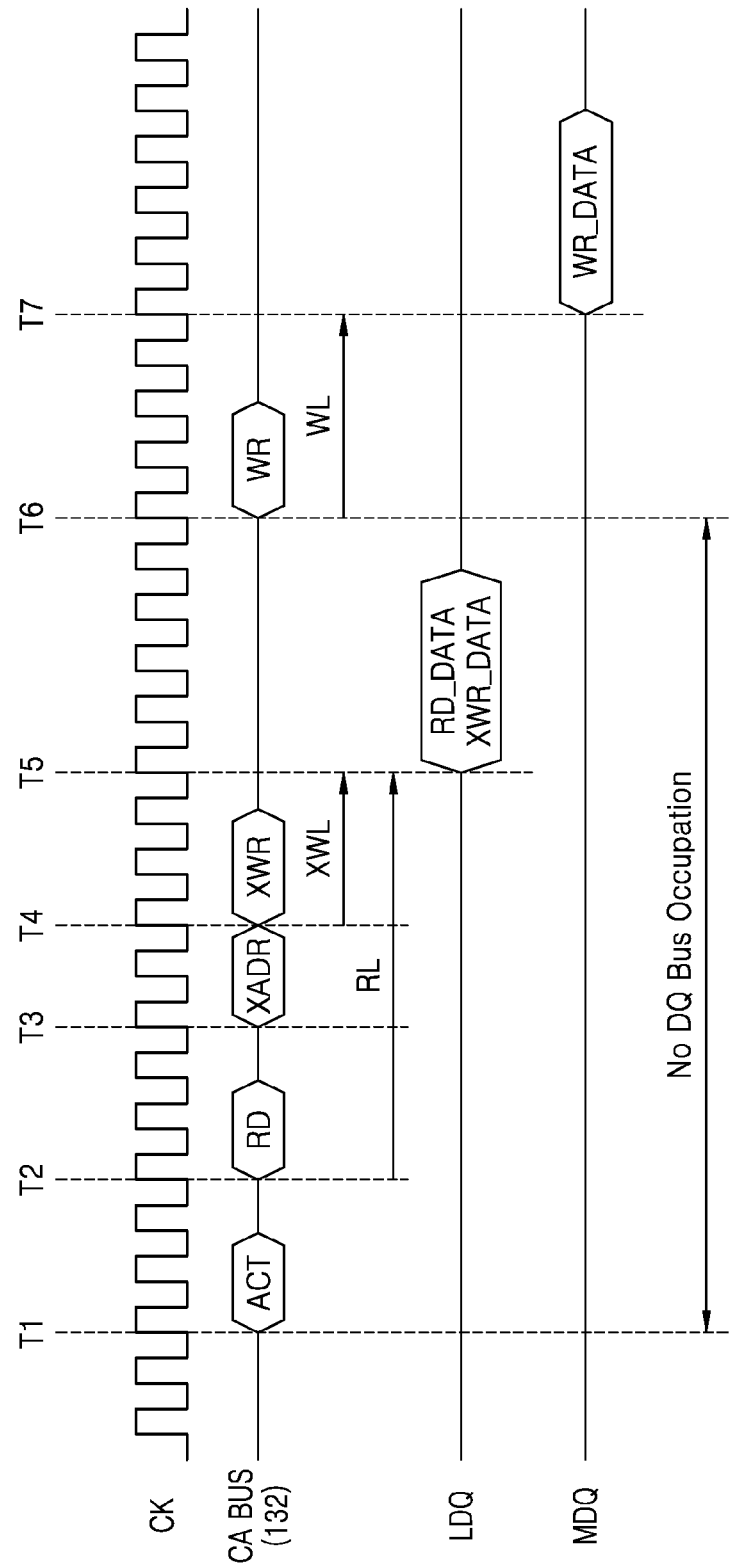
FIGS. 16A and 16B are a timing diagram and a flow diagram, respectfully, for reference in describing a method of operating a data processing system according to an embodiment of the inventive concepts.
Figure 16B:
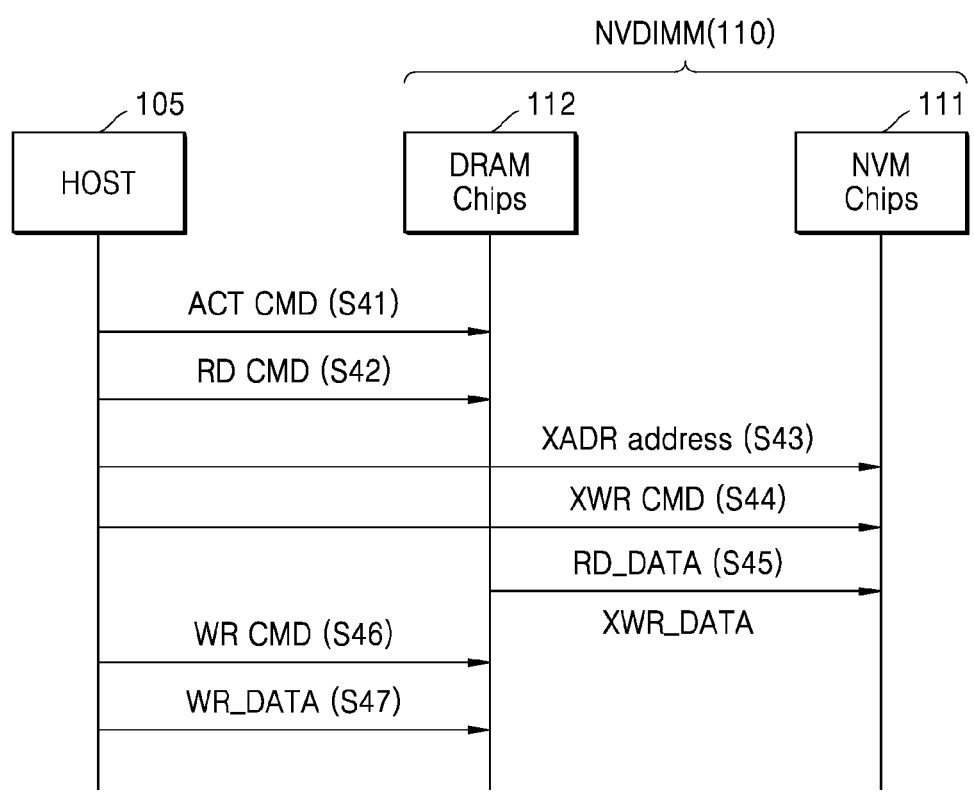

FIGS. 16A and 16B are a timing diagram and a flow diagram, respectfully, for reference in describing a method of operating a data processing system according to an embodiment of the inventive concepts. It is assumed that the method is carried out by the processing system 1000 of previously described FIG. 12.

The operations illustrated from time T1 to time T5 are the same as those described previously in connection with FIG. 15B. That is, at S41 (T1) the host transmits an ACT command which activates the DRAM device 240 through the RCD 220. At S42 (T2), the host transmits a read command to the DRAM device 240. At S43 (T3), the host transmits a NVM write address XADR, which at S44 (T4) is followed by a write command XWR that is applied to NVM controller 1262 through the RCD 220. The difference in time between T2 and T4 corresponds to a difference in read latency between RL and write latency XWL as discussed above. As a result, data RD_DATA read from the DRAM device 240 is transmitted on the data line LDQ as write data XWR_DATA to the NVM controller 1262. As represented in FIG. 16A, the MDQ data line and thus the DQ bus of the host is remains unoccupied by these operations.

FIGS. 16A and 16B further illustrate a subsequent write operation from the host 100 to the DRAM device 240. That is, at S46 (T6), a write command WR is transmitted from the host 100 to the DRAM device 240 by way of the RCD 220. Although not shown, the write command WR may include a write address of the DRAM device 240, In addition, although not shown, the write command WR may be accompanied by a flag signal indicating the first transfer mode of FIG. 5B to place the first I/O port 241 in a data reception state.

After a write latency WL of the DRAM device 240, write data WR_DATA is transmitted on the data line MDQ to be written to the DRAM device 240.

Figure 17A:
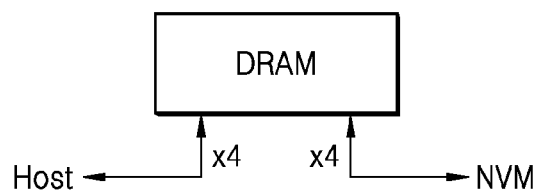
FIGS. 17A, 17B and 17C are schematic diagrams of DRAM configurations according to embodiments of the inventive concepts.
Figure 17B:
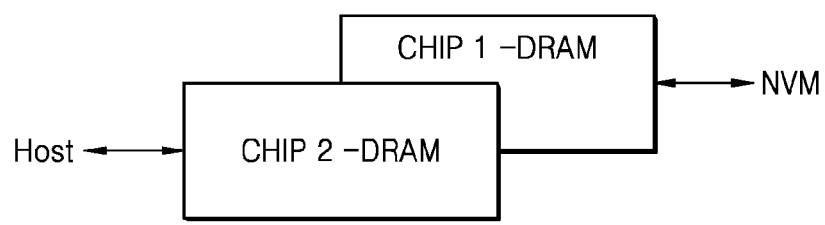
Figure 17C:
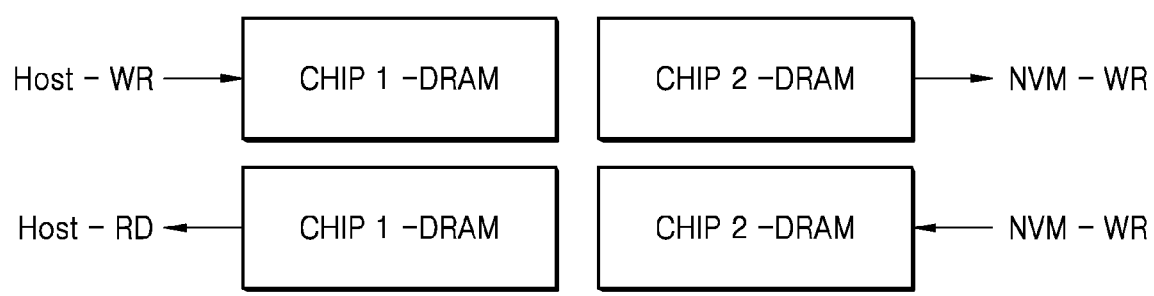

FIGS. 17A, 17B and 17C are schematic diagrams of DRAM configurations according to embodiments of the inventive concepts.

In flushing data using a conventional configuration, the data is read from the DRAM by the host, and then written to the NVM by the host. As such, an occupation time of the DQ bus of the host is relatively long, and host resources are utilized. Also, in conventional configurations, only a ×4 option of the DRAM is utilized while the remaining ×4 of the DRAM remains idle. In the embodiments described above, the remaining ×4 of the DRAM may be used to communicate with the NVM device. This is represented in FIG. 17A where ×4 of the illustrated DRAM is for communication with the host, and the remaining ×4 of the DRAM is for communication with the NVM.

Also, the first and second I/O ports 241 and 242 of the embodiments may belong to the same DRAM chip or different DRAM chips. For example, the DRAM device 240 may be a stack of multiport DRAM chips such as that represented in FIG. 17B. In that case, the multiplexer of the DRAM device 240 may be configured to select first and second I/O ports of respectively different multiport DRAM chips as shown in FIG. 17B or to select first and second I/O ports of a same multiport DRAM chip according to the transfer mode of the command signal. In addition, the multiplexer may be driven to simultaneously transfer first data to the NVM device from a first or second I/O port of one of the stack of multiport DRAM chips, and second data to an external device from a first or second I/O port of another of the stack of multiport DRAM chips. Further, the multiplexer may be configured to simultaneously transfer data to the NVM from a first I/O port of one of the stack of multiport DRAM chips and to an external device from a second I/O port of the one of the stack of multiport DRAM chips. In addition, as represented in FIG. 17C, different DRAM chips may be utilized for receiving data from the host, transmitting data to the host, receiving data from the NMV, and transmitting data to the NMV.

Figure 18A:
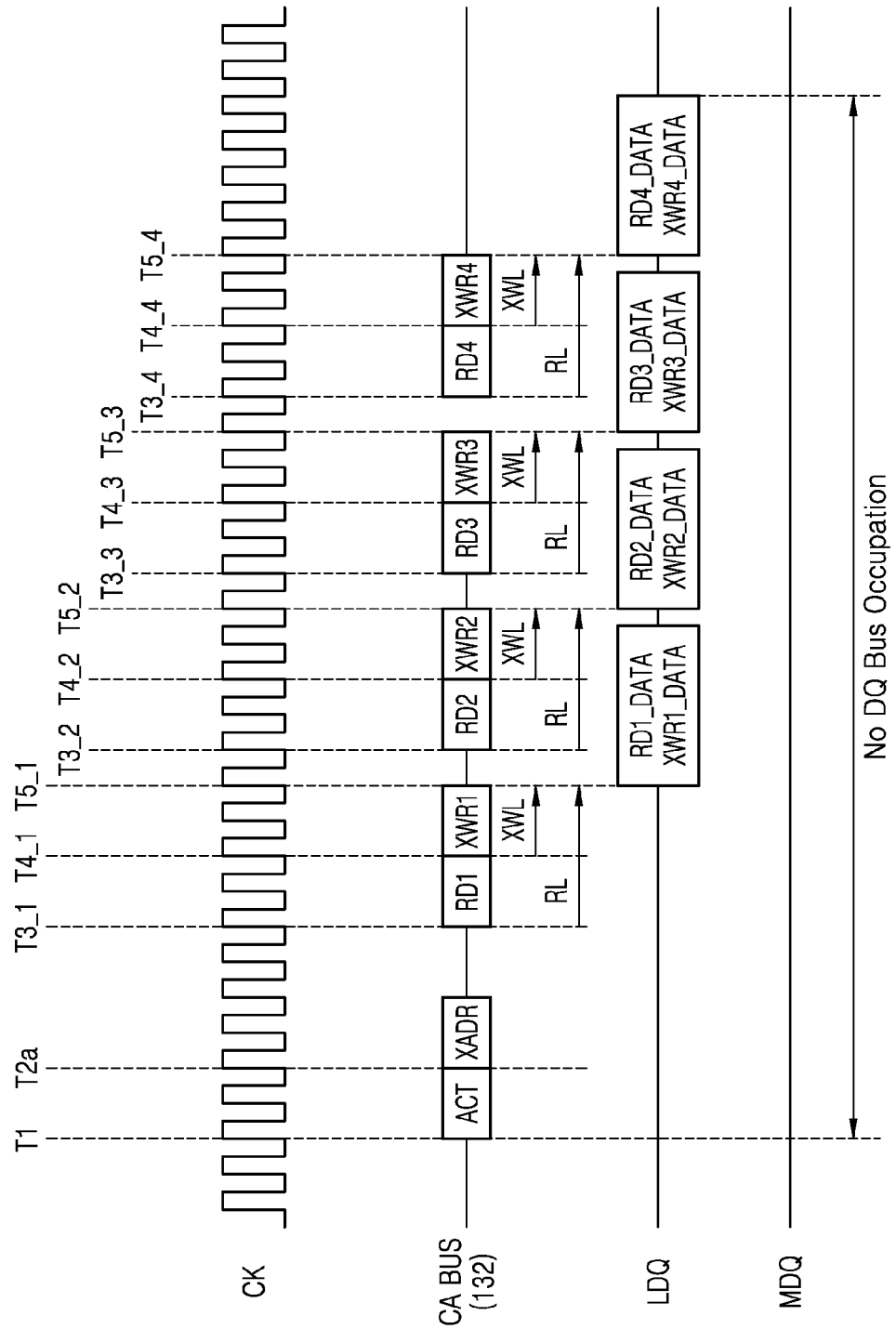
FIGS. 18A and 18B are a timing diagram and a flow diagram for reference in describing an example of multiple transfers of data using a single activation command according to embodiments of the inventive concepts.
Figure 18B:
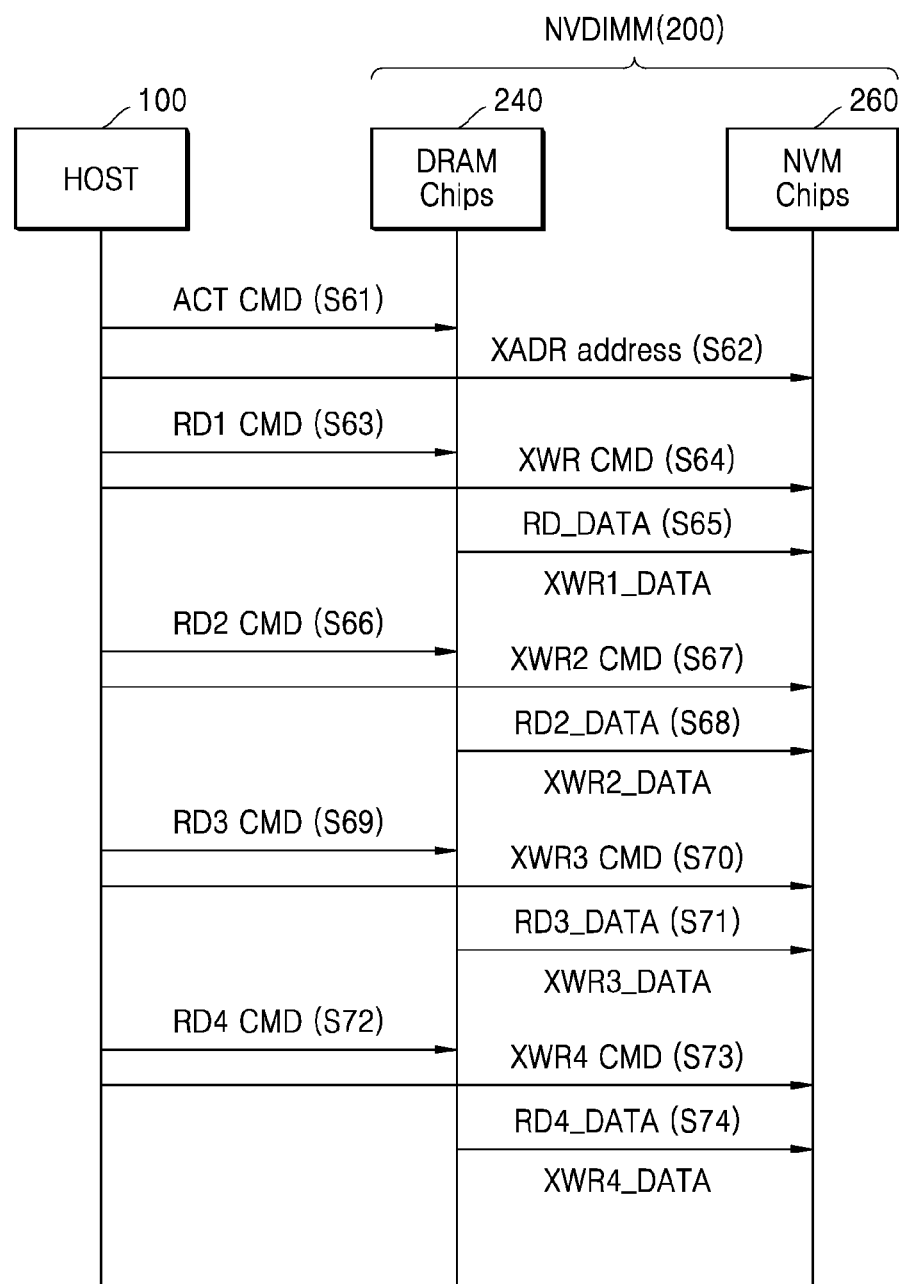

FIGS. 18A and 18B are a timing diagram and a flow diagram for reference in describing an example of multiple transfers of data from the DRAM device 240 to the NMV 260 using a single activation command ACT and address XADR.

Referring to FIGS. 18A and 18B, an activation command ACT is transmitted from the host 100 to the DRAM device 240 at time T1 (S61) and an address XADR is transmitted from the host 100 to the NVM 260 at time T2a (S62). Thereafter, as succession of data transfer operations are carried out from the DRAM device 240 to the NVM 260, each of which is similar to that discussed above in connection with FIG. 15B. That is, a first read command is transmitted to the DRAM 240 at time T3_1 and a first write command is transmitted to the NVM 260 at time T4_1, where the difference between times T3_1 and T4_1 corresponds to a difference between a read latency of the DRAM 240 and the write latency of the NVM 260. As a result, first read data RD1_DATA from the DRAM 240 is transmitted on the data line LDQ as first write data XWR1_DATA to the NMV 260. As shown in FIGS. 18A and 18B, this process is repeated in succession for each of read command RD2_CMD and write command XWR2_CMD, read command RD3_CMD and write command XWR3_CMD, and read command RD4_CMD and write command XWR4_CMD. Throughout the entire process, the DQ bus of the host 100 remains unoccupied.

Figure 19A:
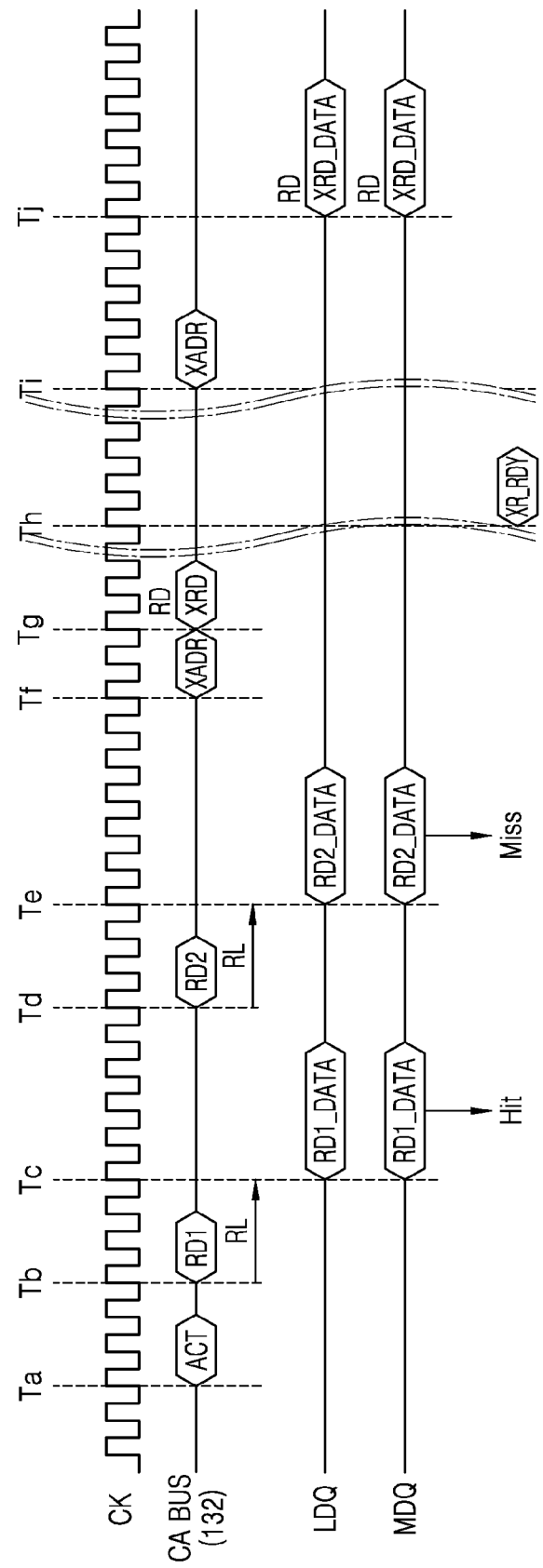
FIGS. 19A and 19B are a timing diagram and a flow diagram for reference in describing an example of such a cache operation of a DRAM device according to embodiments of the inventive concepts.
Figure 19B:
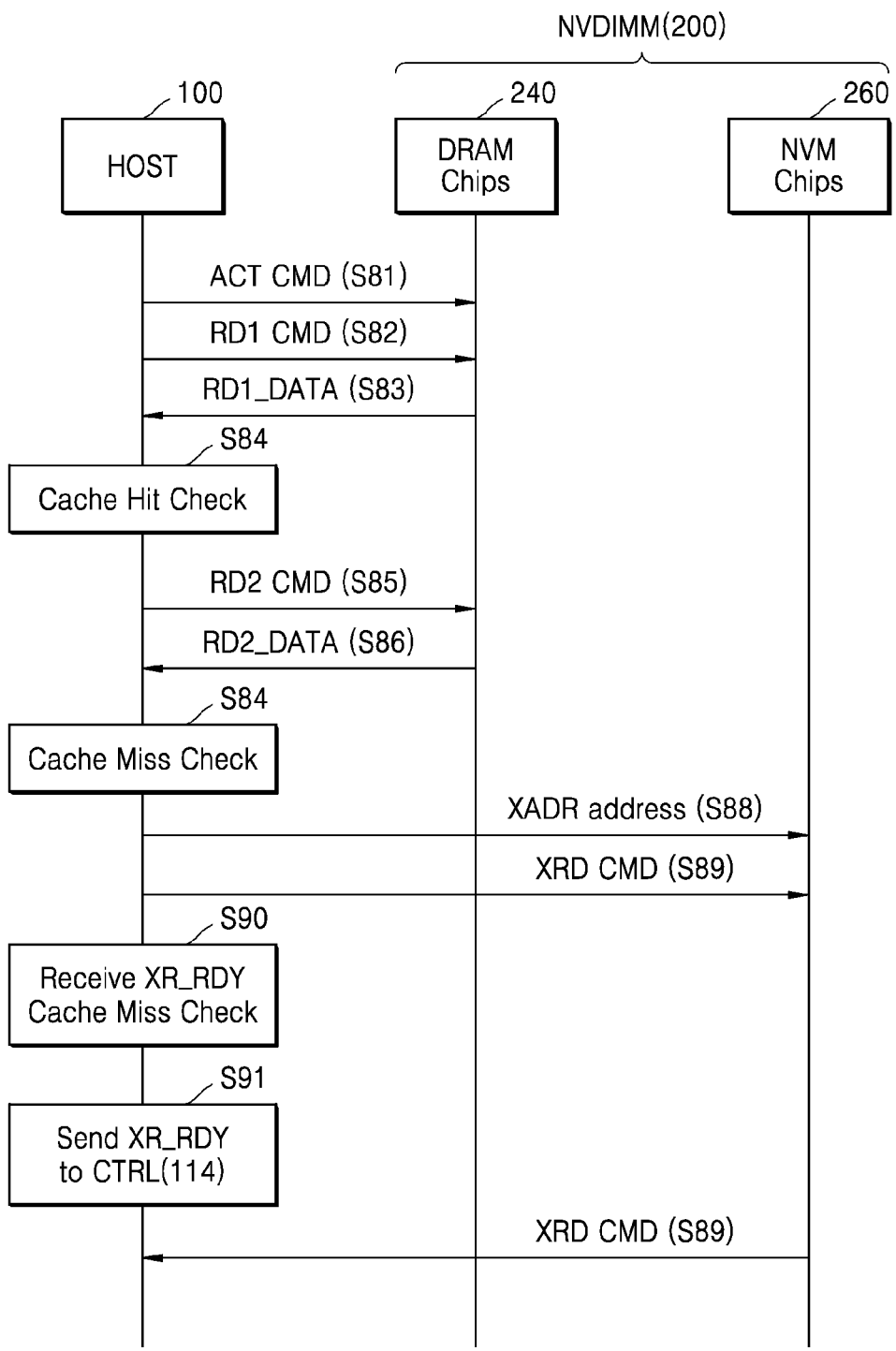

As mentioned previously, the DRAM 240 may operate as a cache memory of the NVM 260. FIGS. 19A and 19B are a timing diagram and a flow diagram for reference in describing an example of such a cache operation of the DRAM device 240.

Initially, after transmitting an activation command ACT (Ta, S81) to the DRAM device 240, the host 100 transmits a first read command RD1_CMD (Tb, S82) to the DRAM device 240. It will be understood that the commands may be transmitted through the RCD 220 as described previously, together with a flag signal indicative of a transfer mode as described previously. Thereafter, first read data RD1_DATA is transmitted (Tc, S83) from the DRAM device 240 to the host 100. At S84 of FIG. 19B, a cache hit check is assumed.

Next, the same data read process is carried out with respect to a second read command RD2_CMD (Td, S85) and second read data RD2_DATA (Te, S86), and a cache hit miss is assumed at S87. In this case, an address XADR (Tf, S88) and a read command XRD_CMD (Tg, S89) are transmitted to the NMV 260. As described previously, data may then be read from the NVM device 1264 and stored in a buffer of the NVM controller 1262. The time duration for storing the read data in the NVM controller 1262 may vary greatly, and accordingly, NVM controller 1262 may transmit an external ready signal XR_RDY (Th, S90) to the host when the read data has been transferred to the buffer of the memory controller 1262. In response to the ready signal XR_RDY, the host 100 sends a send signal XR_SEND to the controller 1262 (Ti, S91), and the data XRD_DATA stored in the buffer of the NVM controller 1262 is transmitted to the host 100 (Tj, S92).

Figure 20B:
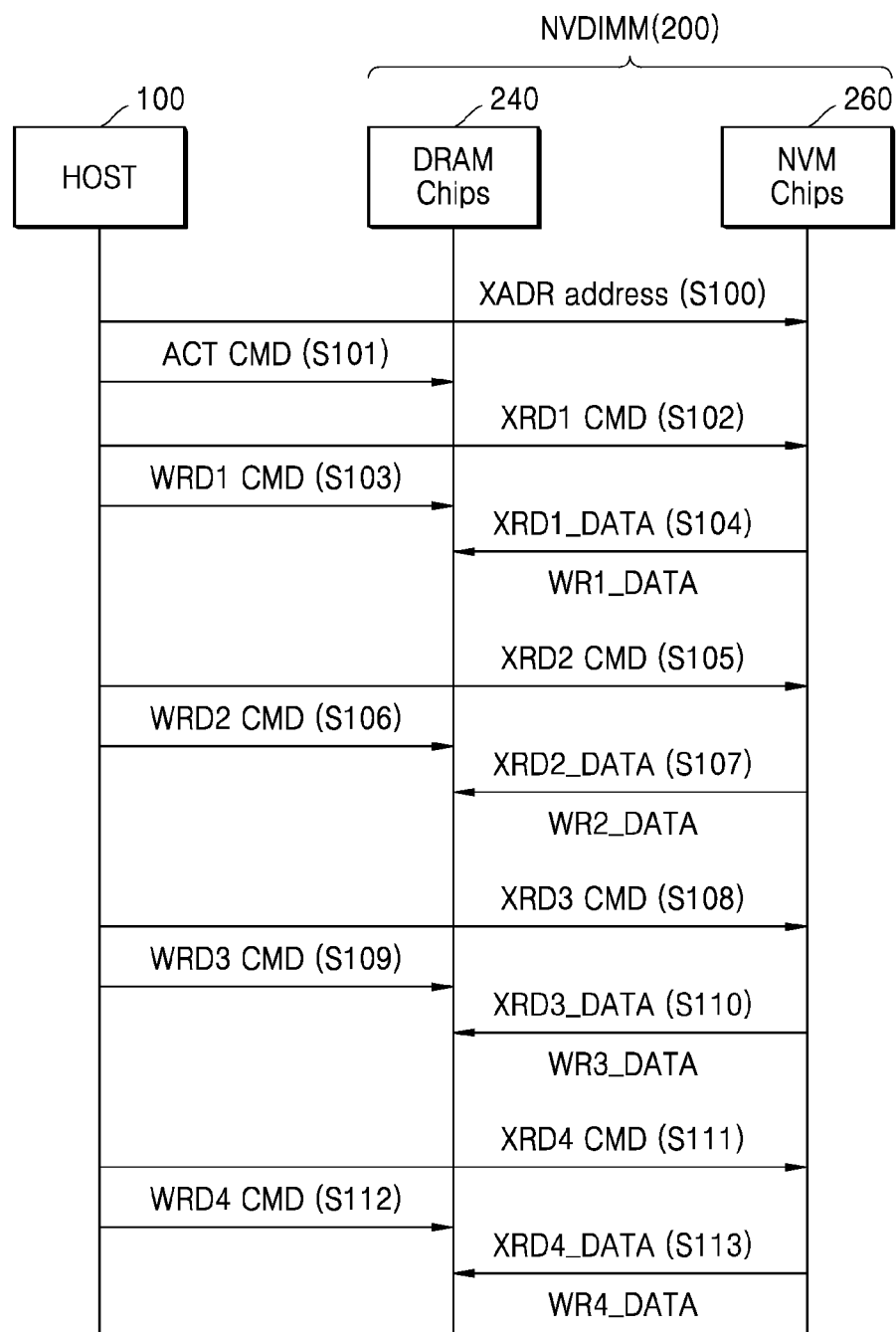

FIGS. 20A and 20B are a timing diagram and a flow diagram for reference in describing an example of multiple transfers of data from the NVM 260 to the DRAM 240 using a single activation ACT and address XADR.

Referring to FIGS. 20A and 20B, an address XADR is transmitted from the host 100 to the NVM 260 at time Ta (S100), and an activation command ACT is transmitted from the host 100 to the DRAM device 240 at time Tb (S101). Thereafter, as succession of data transfer operations are carried out from the NVM 260 to the DRAM device 240. That is, a first read command XRD1_CMD is transmitted to the NVM 260 at time Tc_1, and a first write command is transmitted to the DRAM 240 at time Td_1, where the difference between times Tc_1 and Td_1 corresponds to a difference between a read latency of the NVM 260 and the write latency of the DRAM 240. As a result, at time Te_1, first read data XRD1_DATA from the NVM 260 is transmitted on the data line LDQ as first write data WR1_DATA to the DRAM 240. As shown in FIGS. 18A and 18B, this process is repeated in succession for each of read command XRD2_CMD and write command WR2_CMD, read command XRD3_CMD and write command WR3_CMD, and read command XRD4_CMD and write command WR4_CMD. Throughout the entire process, the DQ bus of the host 100 remains unoccupied.

While the inventive concept has been particularly shown and described with reference to embodiments thereof, it will be understood that various changes in form and details may be made therein without departing from the spirit and scope of the following claims.

What is claimed is:

1. A method of operating a nonvolatile dual in-line memory module (NVDIMM), the NVDIMM including a multiport dynamic random access memory (DRAM), and a nonvolatile memory (NVM) device including an NVM and an NVM controller, the method comprising:
   receiving an externally supplied first command;
   reading data from the NVM and storing the data in the NVM controller in response to the first command;
   transmitting a ready signal externally of the NVDIMM;
   receiving an externally supplied second command;
   transmitting an internal read command to the NVM controller in response to the second command;
   transmitting an internal write command to the DRAM a period of time after transmitting the internal read command to the NVM controller; and
   transferring the data from the NVM controller to the DRAM in response to the internal read and write commands.

2. The method of claim 1, wherein the period of time corresponds to a difference between a read latency of the NVM controller and a write latency of the DRAM.

3. The method of claim 1, wherein the NVDIMM further includes a register clock driver that receives the externally supplied first and second commands, and transmits the internal read and write commands to the NVM controller and DRAM, respectively.

4. The method of claim 1, wherein the DRAM includes a first input/out (I/O) port connected to an external device and a second I/O port connected to the NVM, and wherein the data is transferred from the NVM controller to the DRAM using the second I/O port.

5. The method of claim 4, further comprising transferring the data directly from the second I/O port to the first I/O port using a data path of the DRAM which bypasses memory cells of the DRAM.

6. The method of claim 1, wherein the DRAM is a stack of DRAM chips.

7. A nonvolatile dual in-line memory module (NVDIMM), comprising:
   a multiport dynamic random access memory (DRAM) including memory cells, a first input/output (I/O) port and a second I/O port;
   a nonvolatile memory (NVM) connected to the second I/O port of the multiport DRAM;
   wherein the multiport DRAM further includes a data path generating circuit configured to selectively form a first data path between the memory cells and the first I/O port, a second data path between the memory cells and the second I/O port, and a third data path between the first I/O port and the second I/O port that bypasses the memory cells.

8. The NVDIMM of claim 7, wherein the multiport DRAM further includes a control logic that generates first and second control signals, and wherein the data path generating circuit comprises:
   a first multiplexer responsive to the first control signal and including a first input connected to the second I/O port and the memory cells, a second input connected to the memory cells, and an output connected to the first I/O port; and
   a second multiplexer responsive to the second control signal and including a first input connected to the first I/O port and the memory cells, a second input connected to the memory cells, and an output connected to the second I/O port.

9. The NVDIMM of claim 8, wherein the multiport DRAM is configured to selectively apply first or second read data from the memory cells to the second inputs of the respective first and second multiplexers.

10. The NVDIMM of claim 8, wherein the multiport DRAM is configured to simultaneously apply first and second read data from the memory cells to the second inputs of the respective first and second multiplexers.

11. The NVDIMM of claim 10, wherein the first and second multiplexers are configured to simultaneously output the first and second read data applied to the second inputs.

12. The NVDIMM of claim 8, further comprising:
   a register clock driver; and
   first and second command signal lines from the register clock driver to the DRAM and NVM, respectively,
   wherein the first and second control signals are generated by the control logic of the multiport DRAM in accordance with a command received on the first command line from the register clock driver.

13. The NVDIMM of claim 7, wherein the multiport DRAM includes a stack of DRAM chips.

14. The NVDIMM of claim 7, wherein the multiport DRAM is a cache for the NVM.

15. The NVDIMM of claim 7, wherein the memory cells are phase-change random access memory (PRAM) cells.

16. A multiport dynamic random access memory (DRAM), comprising:
   memory cells;
   control logic configured to control reading and writing of data from and to the memory cells;
   a first input/output (I/O) port;
   a second I/O port; and
   a data path generating circuit configured to selectively form a first data path between the memory cells and the first I/O port, a second data path between the memory cells and the second I/O port, and a third data path between the first I/O port and the second I/O port that bypasses the memory cells.

17. The multiport DRAM of claim 16, wherein the control logic is further configured to generate first and second control signals in response to an externally supplied command, and wherein the data path generating circuit comprises:
   a first multiplexer responsive to the first control signal and including a first input connected to the second I/O port and the memory cells, a second input connected to the memory cells, and an output connected to the first I/O port; and
   a second multiplexer responsive to the second control signal and including a first input connected to the first I/O port and the memory cells, a second input connected to the memory cells, and an output connected to the second I/O port.

18. The multiport DRAM of claim 16, wherein the memory cells are phase-change random access memory (PRAM) cells.

* * * * *